(12) United States Patent
Lei et al.

(10) Patent No.: US 9,269,604 B2
(45) Date of Patent: *Feb. 23, 2016

(54) WAFER EDGE WARP SUPPRESSION FOR THIN WAFER SUPPORTED BY TAPE FRAME

(71) Applicant: Applied Materials, Inc., Santa Clara, CA (US)

(72) Inventors: Wei-Sheng Lei, San Jose, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/542,422

(22) Filed: Nov. 14, 2014

(65) Prior Publication Data

US 2015/0311107 A1 Oct. 29, 2015

Related U.S. Application Data

(63) Continuation of application No. 14/265,108, filed on Apr. 29, 2014, now Pat. No. 8,912,075.

(51) Int. Cl.
*H01L 21/301* (2006.01)
*H01L 21/683* (2006.01)
(Continued)

(52) U.S. Cl.
CPC ............ *H01L 21/6836* (2013.01); *B32B 3/266* (2013.01); *B32B 37/0076* (2013.01);
(Continued)

(58) Field of Classification Search
CPC . H01L 21/78; H01L 21/6835; H01L 21/6836; H01L 21/67346; H01L 21/67092; H01L 2221/68327; H01L 2221/6834; H01L 2221/68336

USPC ......... 438/462, 463, 113, 460, 464, 114, 976; 257/E21.599

See application file for complete search history.

(56) References Cited

U.S. PATENT DOCUMENTS 4,049,944 A   9/1977 Garvin et al.
4,339,528 A   7/1982 Goldman
(Continued)

FOREIGN PATENT DOCUMENTS

JP   9216085    8/1997
JP   10321908   12/1998
(Continued)

OTHER PUBLICATIONS

Linder, V. et al., "Water-Soluble Sacrificial Layers for Surface Micromachining," www.small-journal.com, 2005, 1, No. 7, 7 pgs.
(Continued)

*Primary Examiner* — Michael Trinh
(74) *Attorney, Agent, or Firm* — Blakely Sokoloff Taylor Zafman LLP

(57) ABSTRACT

Methods of and apparatuses for dicing semiconductor wafers, each wafer having a plurality of integrated circuits, are described. In an example, a method of reducing edge warping in a supported semiconductor wafer involves adhering a backside of a semiconductor wafer to an inner portion of a carrier tape of a substrate carrier comprising a tape frame mounted above the carrier tape. The method also involves adhering an adhesive tape to a front side of the semiconductor wafer and to at least a portion of the substrate carrier. The adhesive tape includes an opening exposing an inner region of the front side of the semiconductor wafer.

20 Claims, 16 Drawing Sheets

(51) Int. Cl.
*H01L 21/78* (2006.01)
*H01L 21/3065* (2006.01)
*H01L 21/308* (2006.01)
*H01L 21/67* (2006.01)
*B32B 37/00* (2006.01)
*B32B 37/22* (2006.01)
*B32B 3/26* (2006.01)

(52) U.S. Cl.
CPC ............ *B32B37/22* (2013.01); *H01L 21/3065* (2013.01); *H01L 21/3085* (2013.01); *H01L 21/67132* (2013.01); *H01L 21/78* (2013.01); *B32B 2307/202* (2013.01); *B32B 2457/14* (2013.01); *H01L 2221/6834* (2013.01); *H01L 2221/68327* (2013.01)

(56) References Cited

U.S. PATENT DOCUMENTS

| | | | |
|---|---|---|---|
| 4,684,437 A | 8/1987 | Donelon et al. | |
| 5,336,638 A | 8/1994 | Suzuki et al. | |
| 5,593,606 A | 1/1997 | Owen et al. | |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 * | 2/2007 | Genda et al. | 438/462 |
| 7,265,033 B2 | 9/2007 | Shigematsu et al. | |
| 7,294,531 B2 * | 11/2007 | Hwang et al. | 438/108 |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,598,120 B2 * | 10/2009 | Yamamoto et al. | 438/106 |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 8,470,115 B2 * | 6/2013 | Tanaka et al. | 156/247 |
| 8,912,075 B1 * | 12/2014 | Lei et al. | 438/460 |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2008/0293221 A1 * | 11/2008 | Yamamoto et al. | 438/464 |
| 2009/0255911 A1 | 10/2009 | Krishnaswami et al. | |
| 2010/0013036 A1 | 1/2010 | Carey | |
| 2010/0216313 A1 | 8/2010 | Iwai et al. | |
| 2010/0248451 A1 | 9/2010 | Pirogovsky et al. | |
| 2011/0014777 A1 | 1/2011 | Haji et al. | |
| 2011/0312157 A1 | 12/2011 | Lei et al. | |
| 2012/0100325 A1 * | 4/2012 | Maruyama et al. | 428/41.6 |
| 2013/0045554 A1 | 2/2013 | Yamazaki | |
| 2013/0065378 A1 | 3/2013 | Johnson et al. | |
| 2013/0230972 A1 | 9/2013 | Johnson et al. | |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection," U.S. Appl. No. 61/491,693, filed May 31, 2011 24 pgs.

Ouye, Alan Hiroshi "Plasma Thermal Shield for Heat Dissipation in Plasma Chamber," U.S. Appl. No. 14/109,820, filed Dec. 17, 2013 67 pgs.

* cited by examiner

TOP VIEW

BOTTOM VIEW

WAFER EDGE WARP SUPPRESSION FOR THIN WAFER SUPPORTED BY TAPE FRAME

CROSS-REFERENCE TO RELATED APPLICATIONS

This application is a continuation of U.S. patent application Ser. No. 14/265,108, filed on Apr. 29, 2014, now U.S. Pat. No. 8,912,075, the entire contents of which are hereby incorporated by reference herein.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dies. In addition, cracks can form and propagate from the edges of the dies into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dies on the wafer to prevent damage to the integrated circuits, e.g., the chips and cracks are maintained at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dies. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of reducing edge warping in a supported semiconductor wafer involves adhering a backside of a semiconductor wafer to an inner portion of a carrier tape of a substrate carrier comprising a tape frame mounted above the carrier tape. The method also involves adhering an adhesive tape to a front side of the semiconductor wafer and to at least a portion of the substrate carrier. The adhesive tape includes an opening exposing an inner region of the front side of the semiconductor wafer.

In another embodiment, an apparatus includes a supported semiconductor wafer. The apparatus includes a substrate carrier having a tape frame mounted above a carrier tape. A semiconductor wafer is included and has a backside mounted to an inner portion of the carrier tape. An adhesive tape is adhered to a front side of the semiconductor wafer and to at least a portion of the substrate carrier. The adhesive tape has an opening exposing an inner region of the front side of the semiconductor wafer.

In another embodiment, a method of dicing a semiconductor wafer having a plurality of integrated circuits involves introducing a substrate supported by a substrate carrier into a plasma etch chamber. The substrate has a patterned mask thereon covering integrated circuits and exposing streets of the substrate. The substrate carrier includes a tape frame mounted above a carrier tape, and a backside of the substrate is mounted to an inner portion of the carrier tape. An adhesive tape is adhered to a front side of the substrate and to at least a portion of the substrate carrier. The adhesive tape includes an opening exposing an inner region of the front side of the semiconductor wafer. The method also involves plasma etching the substrate through the streets to singulate the integrated circuits.

DETAILED DESCRIPTION

Methods of and apparatuses for dicing semiconductor wafers, each wafer having a plurality of integrated circuits thereon, are described. In the following description, numerous specific details are set forth, such as substrate carriers for thin wafers, scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to approaches for suppressing wafer edge warping for thin wafers mounted on a mounting tape of a carrier tape frame. Some embodiments are directed to providing reduced warping of a wafer supported by a dicing tape during a dicing process, such as during a hybrid laser scribing and plasma etching dicing process.

To provide context, a common issue when processing a thin wafer mounted on a tape frame involves situations where the wafer edge readily warps upward by approximately 100 microns or even as much as to 300 or more microns as measured from a horizontal level of wafer backside. In some circumstances, the extent of warping can be significantly larger than the wafer thickness, where a thinned wafer being processed can be as this as approximately 50 microns. Although not to be bound by theory, such edge warping may be attributed to residual stresses inside the thinned wafer or, possibly, mismatch of the coefficient of thermal expansion between the wafer and a supporting dicing tape. In the latter case, the warping may occur at the time of mounting or even some duration of time after mounting which may result from varying ambient temperatures and conditions during storage of the mounted apparatus.

Figure 1:
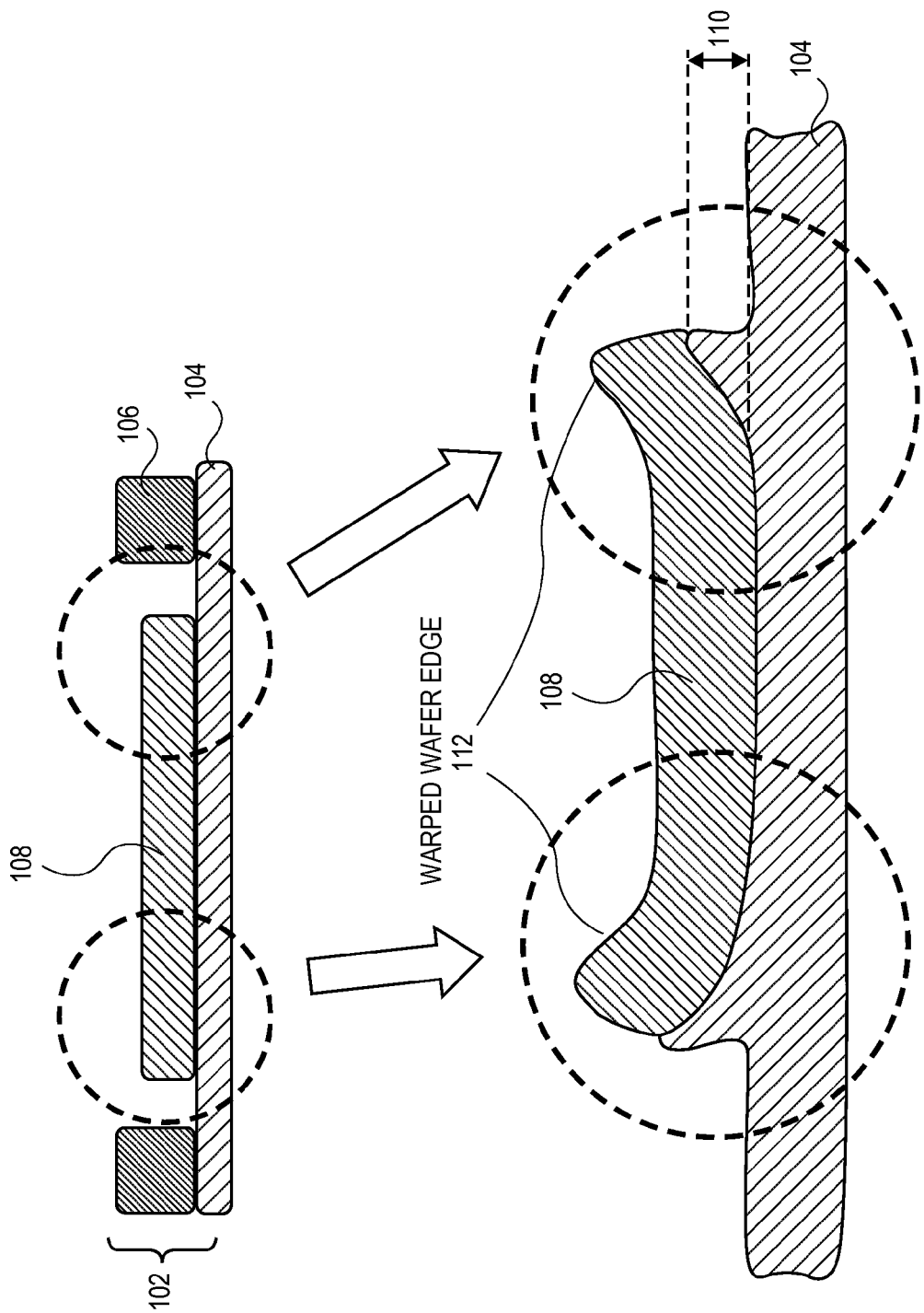
FIG. 1 illustrates a cross-sectional view of a thin wafer mounted on a tape frame with a corresponding enlarged view showing wafer edge warp, in accordance with an embodiment of the present invention.

To demonstrate the concepts at hand, FIG. 1 illustrates a cross-sectional view of a thin wafer mounted on a tape frame with a corresponding enlarged view showing wafer edge warp, in accordance with an embodiment of the present invention. Referring to FIG. 1, a substrate carrier 102 includes a dicing tape 104 and an overlying tape frame 106. A thin wafer 108 is supported on the dicing tape 104 either directly or with an adhesive layer. The tape frame 106 surrounds the thin wafer 108 and holds the dicing tape 106 in a mostly fixed position. The enlarged view depicts an extent of edge warp 110 for a warped wafer edge 112 of the thin wafer 108. It is to be appreciated that the extent of edge warp 110 may be associated with an unsupported substrate carrier 102 or can reflect the extent of edge warp for a supported substrate carrier 102, e.g., a substrate carrier as supported by a chuck in an etch chamber.

Referring again to FIG. 1, the extent of edge warp 110 can be as much as 300 microns high. Such edge warping can create a substantial flat-chucking issue for a variety of processing operations such as, but not limited to, (1) wafer level underfill dry film lamination process and/or (2) wafer dicing processes. In the first example, dry film vacuum lamination processing for wafer level underfill of a dry film onto a wafer mounted on a tape frame may require proper, substantially flat chucking. In the second example, during a laser dicing/scribing process, the laser focus height can differ from wafer center to edge if edge warping occurs, leaving non-uniform laser scribing or missing cuts if the edge of the wafer cannot be chucked on the same plane as the inner zone of wafer. Consequently, during a subsequent plasma dicing operation used for ultimate die singulation, if the edge of wafer cannot be chucked properly the plasma etching process can be detrimentally impacted.

Furthermore, the above described edge warping can have a significant impact for plasma etching in cases where bubbles are formed between the tape and wafer backside around the wafer edge, e.g., as formed at the time of applying the wafer to the dicing tape. Such bubbles can be difficult to avoid during routine application of a thin wafer to a substrate carrier. And, in cases where edge warping is not suppressed, the bubble can be problematic. For example, in the case that only marginal chucking is achieved, e.g., due to edge warping, such air bubbles can expand and extend to the wafer edge during processing, weakening the chucking and possibly triggering etch failure. More specifically, greater tape delamination from a wafer backside can result in plasma etch termination due to outer zone chucking failure caused by wafer edge warping. Furthermore, helium or other chucking gas leakage can occur due to chucking failure at the outer (warped, liftoff) zone even though the inner zone may be properly chucked.

It is to be appreciated that both the edge warping and bubble formation between a wafer backside and carrier or dicing tape (particularly around the wafer edge) are common defects in a high volume manufacturing environment that can be difficult to avoid. Downstream processes such as wafer level underfill dry film vacuum lamination, laser scribing/dicing, or blade dicing, plasma etching, etching, etc., often are required to tolerate or accommodate defects such as those described above. Accordingly, it would be advantageous to suppress an extent of warping of a wafer edge in order to render the whole wafer flat from inner zone to outer zone during processing or processing set-up.

To provide further context, measures have been applied to suppress edge warp-induced plasma etch failure due to incapable or marginal chucking. Such approaches have included the design of a shield ring to provide intimate contact to the wafer edge in order to mechanically "bend down" or reverse the extent of warping. Such mechanical contact, however, can be too extreme for very thin or fragile wafers and can lead to wafer cracking. Additionally, such shield ring can become contaminated by an adhesive layer on the dicing tape located between the wafer edge and the frame. Another approach has involved the use a higher chucking voltage in order to increase the wafer-to-chuck attraction force. However, there is a limit to the extent of increase of the chucking voltage. For example, for scenarios where the extent of warping is greater than approximately 100 microns, the likelihood that a chucking voltage can be relied on only (i.e., without other consequences) to "push down" the wafer edge is very low. Moreover, both approaches may be applicable only for plasma etching, and cannot be used to resolve the same issues in wafer level underfill dry film lamination or laser/blade scribing/dicing.

Addressing one or more of the above described issues, one or more embodiments disclosed herein involve application of a patterned dicing tape onto a wafer front side and on the corresponding mounting tape and frame. The patterned tape may have a central hole with a diameter slightly smaller than the wafer diameter. In one embodiment, an outer edge of the patterned tape is mounted onto the front surface of the supporting dicing tape and frame. Adhesion between the patterned, overlying dicing tape and the wafer-supporting dicing tape may provide for a gentle flattening of a warped wafer edge. In some embodiments, application of the front side patterned dicing tape strengthens the wafer edge. In one embodiment, upon incorporating a front side dicing tape, a wafer can be secured on a substrate carrier for use in operations such as wafer level underfill dry film vacuum lamination, laser scribing and plasma etching. In the case of laser scribing, in a particular embodiment, the patterned front side dicing tape can further act as a sacrificial layer for scenarios where one or more laser pulses are misfired onto the dicing tape area.

Figure 2A:
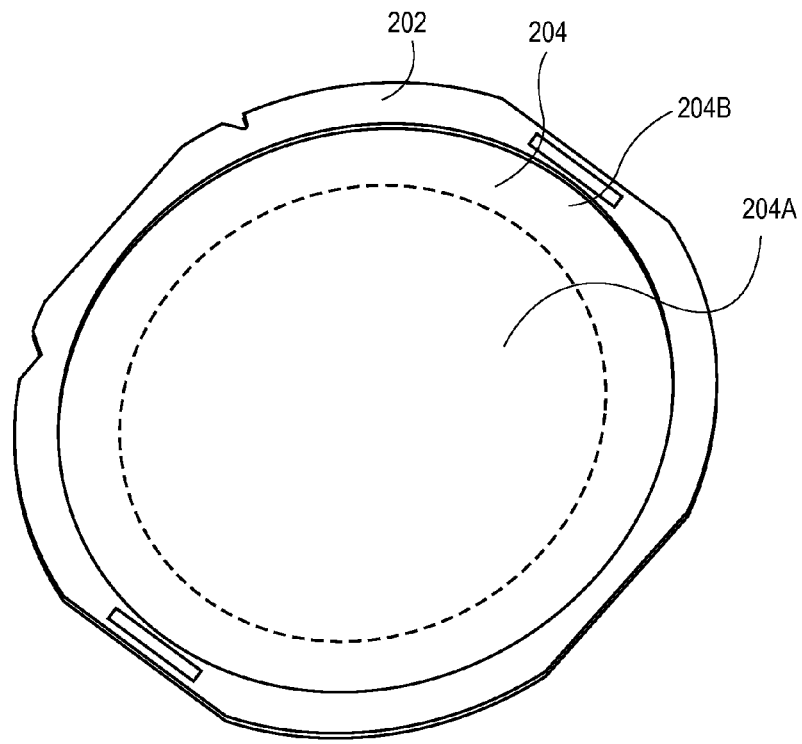
FIGS. 2A-2C illustrate top down views representing various operations in a method of mounting a wafer on a substrate carrier, in accordance with an embodiment of the present invention.
Figure 2B:
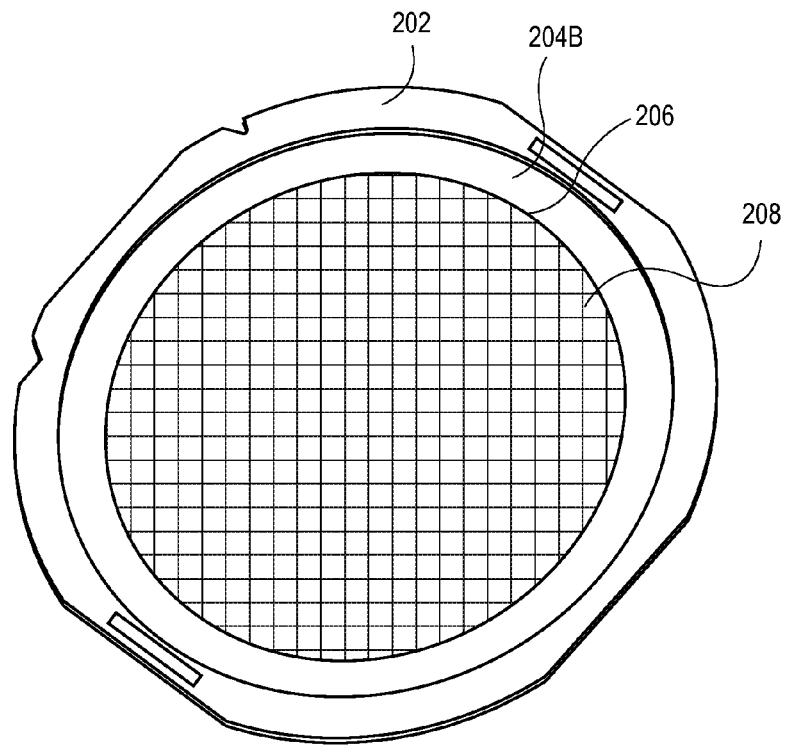
Figure 2C:
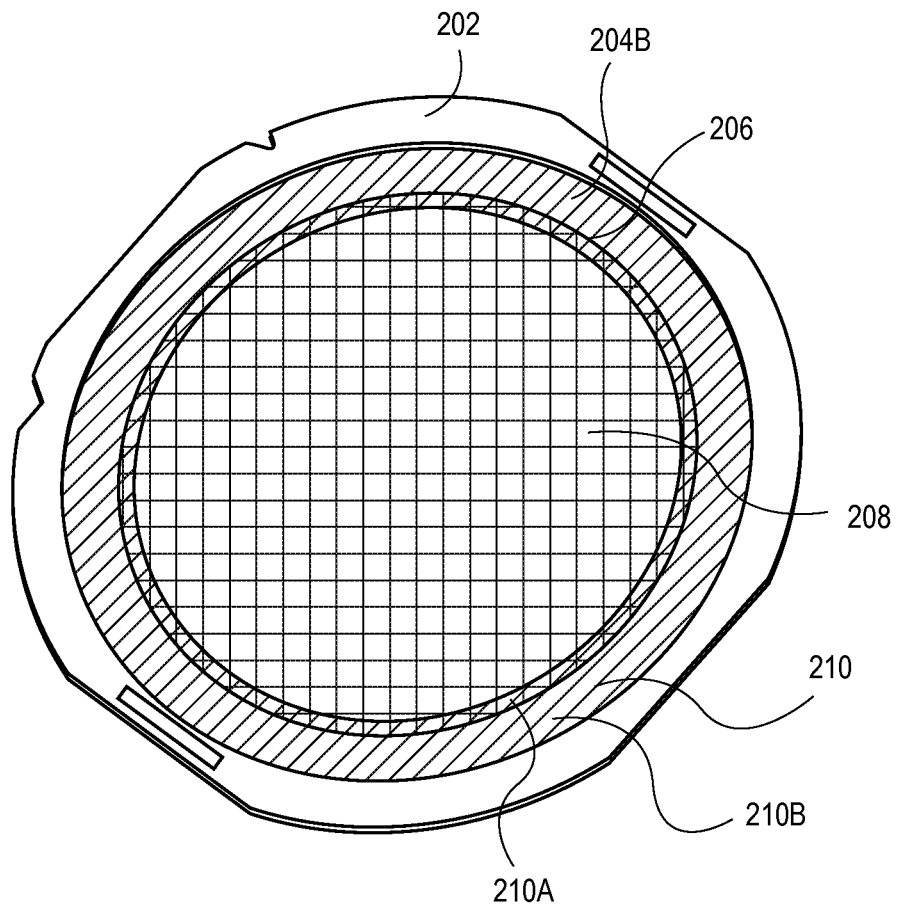

As a general example, FIGS. 2A-2C illustrate top down views representing various operations in a method of mounting a wafer on a substrate carrier, in accordance with an embodiment of the present invention.

Referring to FIG. 2A, a substrate carrier includes a tape frame 202 mounted above a carrier tape 204. The carrier tape 204 includes an inner region 204A and an outer region 204B. Referring to FIG. 2B, a semiconductor wafer 206 is mounted on the inner region 204A of the carrier tape 204, leaving outer region 204B of the carrier tape 204 exposed. In one embodiment, the semiconductor wafer 206 is mounted on the inner region 204A of the carrier tape 204 by the backside of the semiconductor wafer 206 to leave the front side 208 exposed, e.g., with a plurality of integrated circuits exposed, as is depicted in FIG. 2B.

Referring to FIG. 2C, an adhesive tape 210 is adhered to a portion of the front side 208 of the semiconductor wafer 206 and to at least a portion of the substrate carrier. For example, as depicted, the adhesive tape 210 has a region 210A adhered to an outer region of the front side 208 of the semiconductor wafer 206. Another region 210B of the adhesive tape 210 is adhered to the exposed outer region 204B of the carrier tape 204. Although not depicted, in an embodiment, the adhesive tape 210 is larger and is further adhered to at least a portion of, and possibly the entire top surface of, the tape frame 202.

Referring again to FIG. 2C, the adhesive tape 210 has an opening exposing an inner region of the front side 208 of the semiconductor wafer 206. In one such embodiment, the opening exposes an inner region which includes at least approximately 98% of the diameter of the front side 208 of the semiconductor wafer. In one embodiment, a total diameter of the semiconductor wafer 206 is 300 millimeters and the opening leaves exposed a region having a diameter approximately in the range of 295-299 millimeters. In an embodiment, as a result of applying the adhesive tape 210, backside of the semiconductor wafer 206, including edge portions of the semiconductor wafer 206, is substantially flat.

Figure 3:
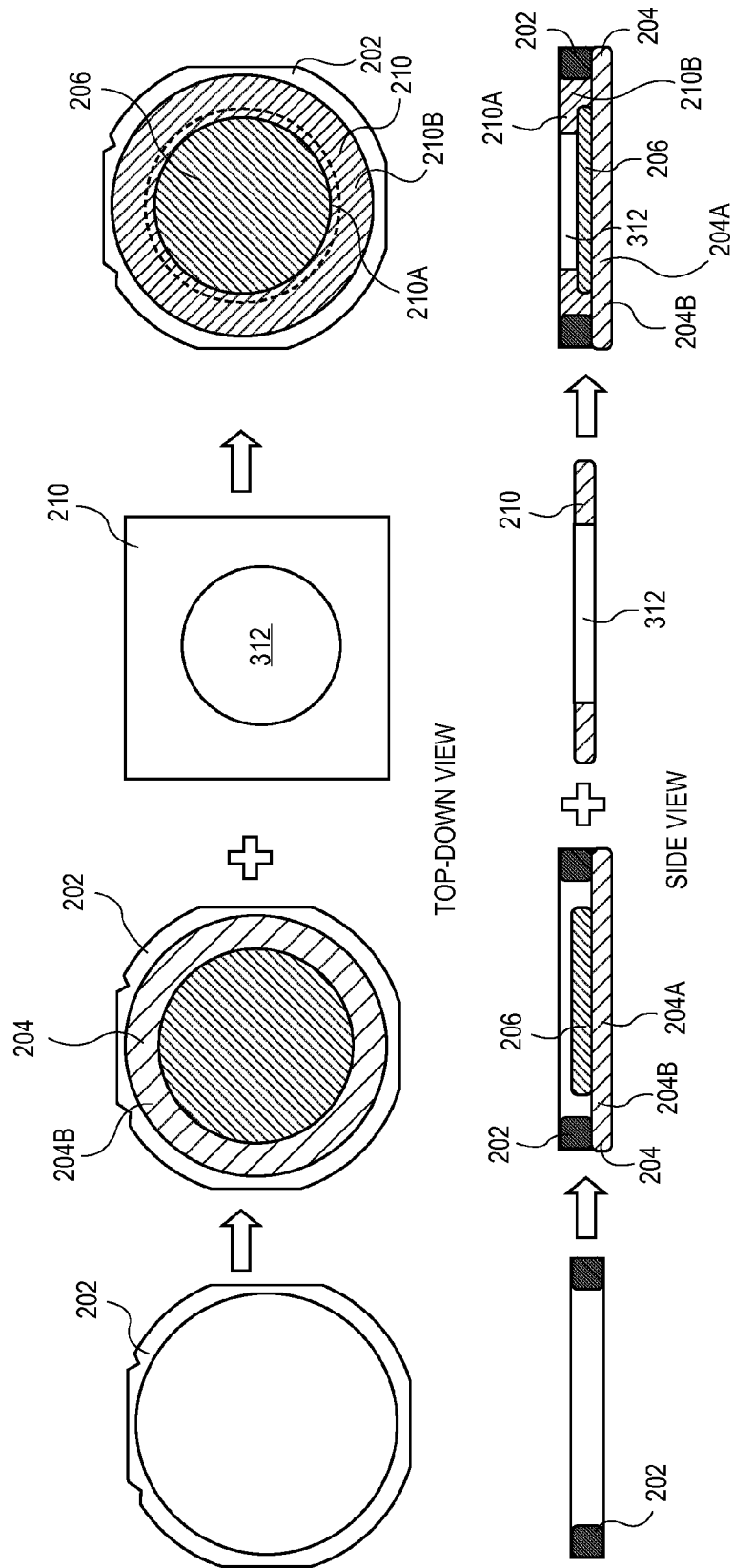
FIG. 3 illustrates plan and corresponding cross-sectional views representing various operations in a method of mounting a wafer on a substrate carrier using front side adhesive or dicing tape for reducing edge warping, in accordance with an embodiment of the present invention.

FIG. 3 illustrates plan and corresponding cross-sectional views representing various operations in a method of mounting a wafer on a substrate carrier using front side adhesive or dicing tape for reducing edge warping, in accordance with an embodiment of the present invention.

Referring to FIG. 3, a backside of a semiconductor wafer 206 is adhered to an inner portion 204A of a carrier tape 204 of a substrate carrier that includes a tape frame 202 mounted above the carrier tape 204. The semiconductor wafer 206 can be mounted directly or via an adhesive layer such as a die attach film. An adhesive tape 210 is adhered to a front side of the semiconductor wafer 206 (portion 210A of adhesive tape 210) and to at least a portion of the substrate carrier (portion 210B of adhesive tape 210). The adhesive tape 210 includes an opening 312 that, once applied, exposes an inner region of the front side of the semiconductor wafer 206.

In an embodiment, upon application of the adhesive tape 210, the inner region of the front side of the semiconductor wafer 206 exposed by the opening 312 is subjected to a processing operation. In a first exemplary embodiment, processing the inner region of the front side of the semiconductor wafer 206 involves dicing the semiconductor wafer 206 from the front side of the semiconductor wafer 206. In one such embodiment, dicing the semiconductor wafer involves applying a dicing mask to the front side of the semiconductor wafer 206. The dicing mask may be applied prior to or subsequent to adhering the adhesive tape 210 to the semiconductor wafer 210 and substrate carrier. In a second exemplary embodiment, processing the inner region of the front side of the semiconductor wafer 206 involves applying a dry film laminate to the front side of the semiconductor wafer 206.

In another aspect, with the front side adhesive or dicing tape in place, one or more embodiments described herein are directed to a shadow or cover ring for heat dissipation in a plasma etch chamber used to etch a substrate adhered to a substrate carrier with a front side adhesive or dicing tape. Embodiments may include plasmas and plasma based processes, thermal management, active cooling, and heat dissipation. One or more embodiments described herein are directed to an actively-cooled shadow ring or to a plasma thermal shield for heat dissipation in a plasma chamber.

In accordance with an embodiment of the present invention, described herein are one or more apparatuses for, and methods of, protecting a substrate carrier composed of thin wafer tape and a tape frame during plasma etch in a singulation process. For example, an apparatus may be used to support and protect the film and film frame used to hold a thin silicon wafer from etch gases. The manufacturing processes related to integrated circuit (IC) packaging may require that a thinned silicon wafer be supported and mounted on a carrier film.

As described above, a substrate for dicing is supported by a substrate carrier during the plasma etching portion of a die singulation process, e.g., of a hybrid laser ablation and plasma etching singulation scheme. For example, FIG. 4A illustrates a plan view of a substrate carrier suitable for supporting a wafer during a singulation process, in accordance with an embodiment of the present invention.

Figure 4A:
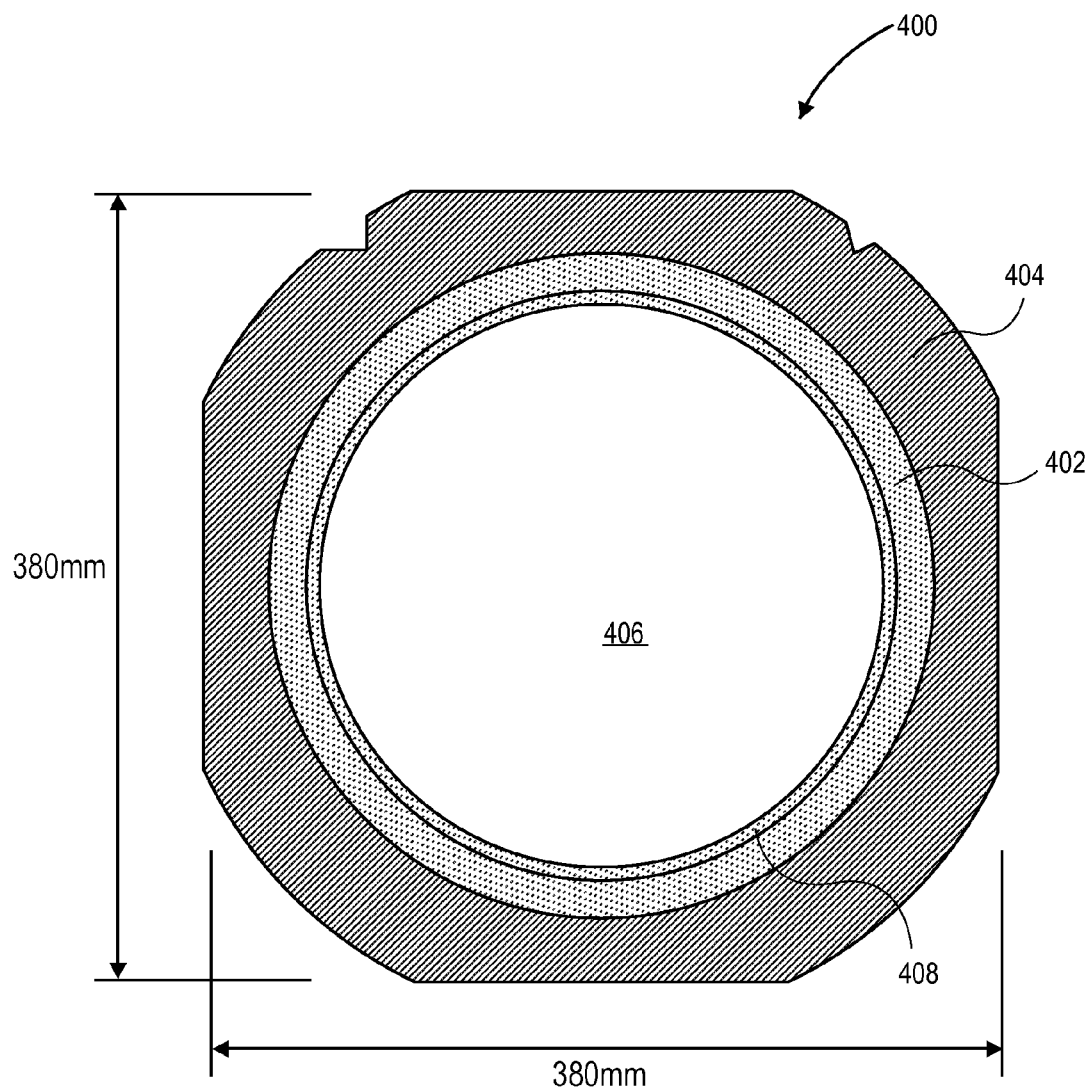
FIG. 4A illustrates a plan view of a substrate carrier suitable for supporting a wafer during a singulation process, in accordance with an embodiment of the present invention.

Referring to FIG. 4A, a substrate carrier 400 includes a region of a layer of backing tape 402 surrounded by a tape ring or frame 404. A wafer or substrate 406 is supported by the backing tape 402 of the substrate carrier 400. In one embodiment, the wafer or substrate 406 is attached to the backing tape 402 by a die attach film. In one embodiment, the tape ring 404 is composed of stainless steel. Referring again to FIG. 4A, in an embodiment, an overlying adhesive tape 408 is adhered to a front side of the semiconductor wafer 406 and to at least a portion of the substrate carrier 400. The adhesive tape 408 has an opening exposing an inner region (non-shaded portion) of the front side of the semiconductor wafer 406.

In an embodiment, a singulation process can be accommodated in a system sized to receive a substrate carrier such as the substrate carrier 400. In one such embodiment, a system such as system 1300, described in greater detail below, can accommodate a wafer frame without impact on the system footprint that is otherwise sized to accommodate a substrate or wafer not supported by a substrate carrier. In one embodiment, such a processing system is sized to accommodate 300 millimeter-in-diameter wafers or substrates. The same system can accommodate a wafer carrier approximately 380 millimeters in width by 380 millimeters in length, as depicted in FIG. 4A. However, it is to be appreciated that systems may be designed to handle 450 millimeter wafers or substrate or, more particularly, 450 millimeter wafer or substrate carriers.

In an embodiment, a substrate carrier is accommodated in an etch chamber during a singulation process. In an embodiment, the assembly including a wafer or substrate on the substrate carrier is subjected to a plasma etch reactor without affecting (e.g., etching) the film frame (e.g., tape ring 404) and the film (e.g., backing tape 402). In one such embodiment, an actively-cooled shadow ring or a plasma thermal shield, or both, are implemented during the etch portion of the dicing process. In an example, FIG. 4B illustrates the substrate carrier of FIG. 4A with an overlying actively-cooled shadow ring or a plasma thermal shield, or both, in accordance with an embodiment of the present invention.

Figure 4B:
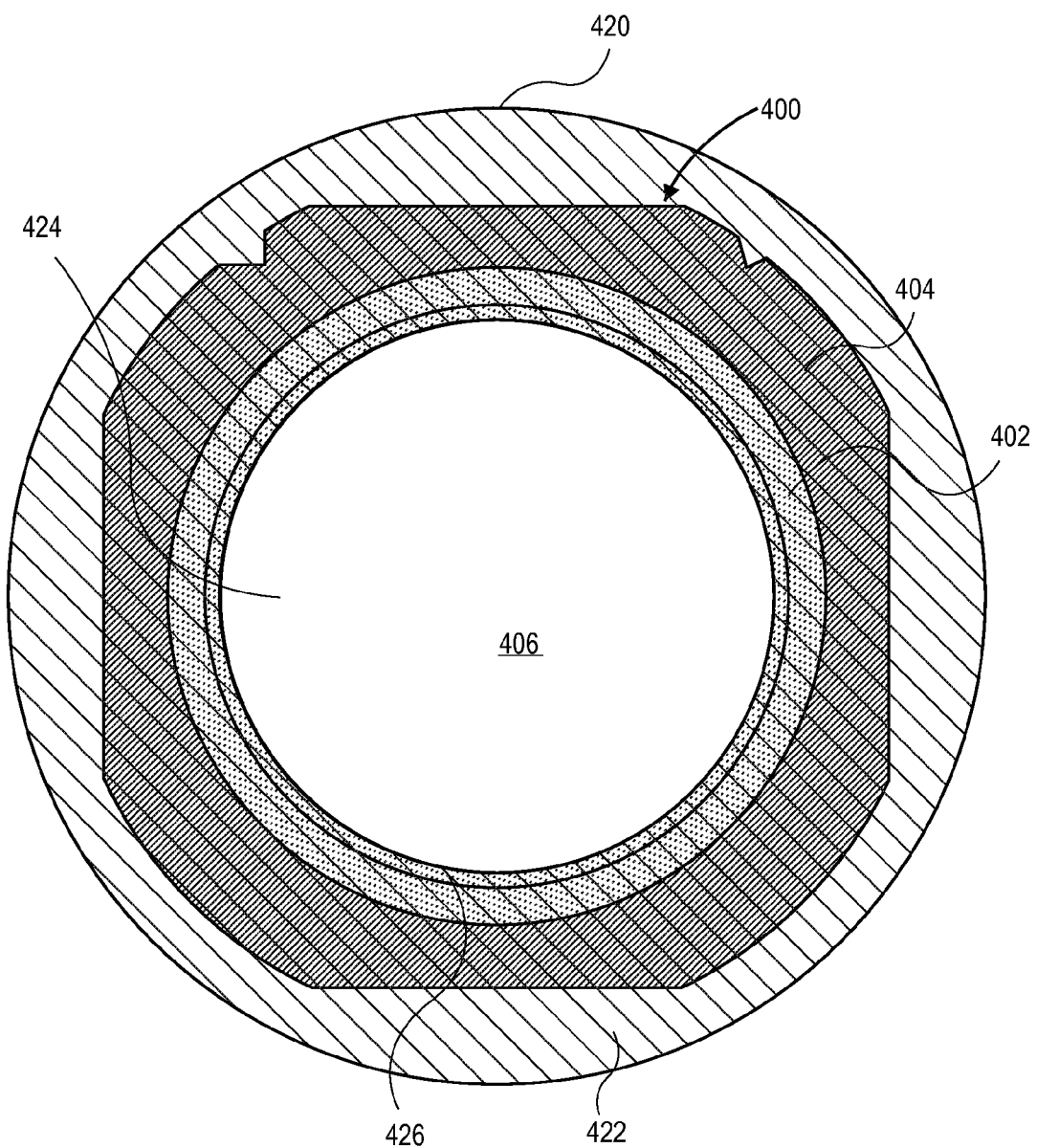
FIG. 4B illustrates the substrate carrier of FIG. 4A with an overlying shadow ring or plasma thermal shield, or both, in accordance with an embodiment of the present invention.

Referring to FIG. 4B, the substrate carrier 400, including the layer of backing tape 402 and tape ring or frame 404 is covered, in a top view perspective, by an actively-cooled shadow ring or a plasma thermal shield, or both, (all options represented as 420 in FIG. 4B). The actively-cooled shadow ring or a plasma thermal shield, or both, 420 includes a ring portion 422 and inner opening 424. In one embodiment, a portion of the supported wafer or substrate 406 is also covered by the actively-cooled shadow ring or a plasma thermal shield, or both, 420 (specifically, portion 426 of the actively-cooled shadow ring or a plasma thermal shield, or both, 420 covers a portion of the wafer or substrate 406). In a specific such embodiment, the portion 426 of the actively-cooled shadow ring or a plasma thermal shield, or both, 420 covers approximately 1-1.5 mm of the outer most portion of the wafer or substrate 406. The portion covered may be referred to as the exclusion region of the wafer or substrate 406 since this area is effectively shielded from a plasma process. Referring again to FIG. 4B, in an embodiment, the portion 426 of the actively-cooled shadow ring or a plasma thermal shield, or both, 420 covers at least a portion of the overlying adhesive tape 408 adhered to the front side of the semiconductor wafer 406. In one such embodiment, the portion 426 of the actively-cooled shadow ring or a plasma thermal shield, or both, 420 covers all of the portion of the overlying adhesive tape 408 adhered to the front side of the semiconductor wafer 406 as well as the portions of the overlying adhesive tape 408 adhered to the substrate carrier.

In a first such aspect, an actively-cooled shadow ring for heat dissipation in a plasma chamber is now described in greater detail. In an embodiment, an actively-cooled shadow ring can be implemented to reduce a temperature of a process kit shadow ring during processing of a wafer supported by a wafer carrier. By reducing the temperature of a shadow ring, damage or burning of a die singulation tape that otherwise occurs at elevated temperatures may be mitigated. For example, a damaged or burned die singulation tape normally leads to the wafer or substrate as not being recoverable. Furthermore, the attached tape can become damaged when the tape frame reaches an elevated temperature. Although described herein in the context of tape and frame protection during etch processing for die singulation, use of an actively-cooled shadow ring can provide other process benefits can include an increase in throughput. For example, temperature reduction may otherwise be achieved by easing of process conditions such as RF power reduction, but this requires an increase in process time which is detrimental to throughput.

Figure 5:
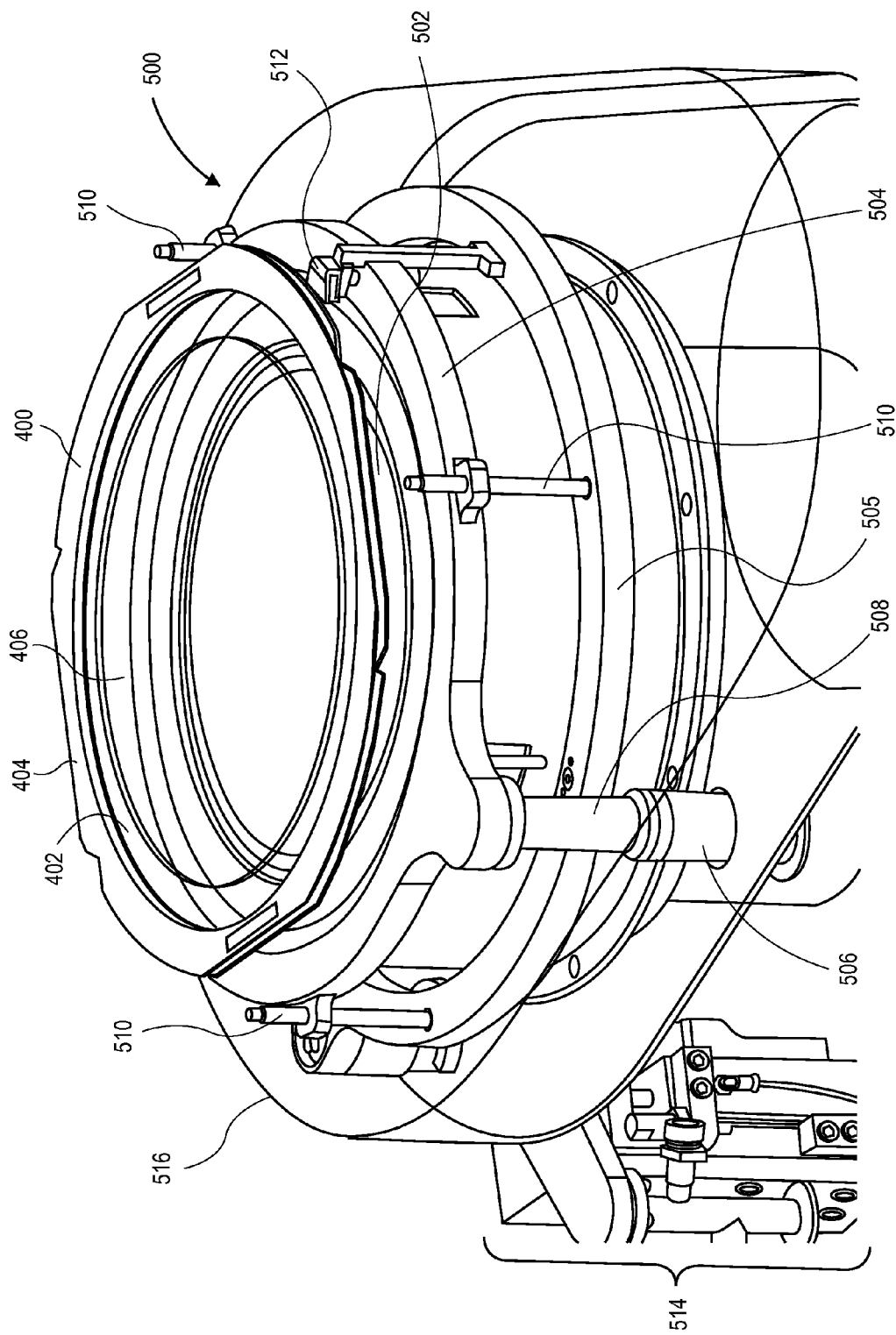
FIG. 5 illustrates an angled view of an actively-cooled shadow ring for heat dissipation in a plasma chamber with relative positioning to an etch cathode shown and relative sizing to a wafer support shown, in accordance with an embodiment of the present invention.

FIG. 5 illustrates an angled view of an actively-cooled shadow ring for heat dissipation in a plasma chamber with relative positioning to an etch cathode shown and relative sizing to a wafer support shown, in accordance with an embodiment of the present invention.

Referring to FIG. 5, a support apparatus 500 for a plasma chamber includes a cathode 502 positioned below an actively-cooled shadow ring 504. A wafer or substrate support 400 with a tape 402 and frame 404 and supporting a wafer of substrate 406 is shown above the actively-cooled shadow ring 504 for sizing perspective. Such a wafer or substrate support can be as described above with respect to FIG. 4A. In use, the wafer or substrate support 400 is actually position between the actively-cooled shadow ring 504 and the cathode 502. The support apparatus 500 may also include a motorized assembly 514 and a casing 516, which is also depicted in FIG. 5. In an embodiment, although not shown in FIG. 5, in an embodiment, an overlying adhesive tape is adhered to a front side of the semiconductor wafer 406 and to at least a portion of the substrate carrier 400. The adhesive tape has an opening exposing an inner region of the front side of the semiconductor wafer 406.

Referring again to FIG. 5, the actively-cooled shadow ring 504 is fed with coolant gas or liquid by a bellows feed-through 506 which feeds into a plasma exposed coupler 508. In an embodiment, the actively-cooled shadow ring 504 is raised or lowered relative to a fixed cathode by three vertical posts 510 which can be raised for introduction of the substrate or wafer carrier 300 to the cathode 502 and then lowered to clamp the substrate or wafer carrier 300 into position. The three vertical posts 510 attach the actively-cooled shadow ring 504 to a circular ring 505 below. The circular ring 505 is connected to the motorized assembly 514 and provides the vertical motion and positioning of the actively-cooled shadow ring 504.

The substrate or wafer carrier 400 may rest on a plurality of pads that sit between the actively-cooled shadow ring 504 and the cathode 502. For illustrative purposes, one such pad 512 is depicted. However, it is to be appreciated that the pad 512 is actually below or underneath the actively-cooled shadow ring 504, and that more than one pad is typically used, such as four pads. In an embodiment, the actively-cooled shadow ring 504 is composed of aluminum with a hard anodized surface or a ceramic coating. In an embodiment, the actively-cooled shadow ring 504 is sized to entirely cover, from a top-down perspective, the tape frame 404, the tape 402, and the outer most region of the substrate 406 during plasma processing, as was described in association with FIG. 4B. In one specific such embodiment, the leading edge of the shadow ring to the wafer is approximately 0.050 inches high.

In an embodiment, the cathode 502 is an etch cathode and can function as an electrostatic chuck to assist in sample clamping during processing. In one embodiment, the cathode 502 is thermally controlled.

In an embodiment, the actively-cooled shadow ring 504 is capable of dissipating a large quantity of plasma heat and in a short period of time. In one such embodiment, the actively-cooled shadow ring 504 is designed to be capable of reducing a shadow ring from temperatures greater than 260 degrees Celsius to less than 120 degrees Celsius on a continuous processing basis. In an embodiment, with a vacuum-to-atmosphere connection available, an internal plasma-exposed component could be cooled and/or vertically-moved in a chamber.

In a second such aspect, a plasma thermal shield for heat dissipation in a plasma chamber is now described in greater detail. The plasma thermal shield can be used with a standard shadow ring as an inexpensive, passive component for thermal protection of substrate carrier that is plasma etched using a conventional shadow ring. On the other hand, the plasma thermal shield may be used together with the above described actively-cooled shadow ring.

Figure 6:
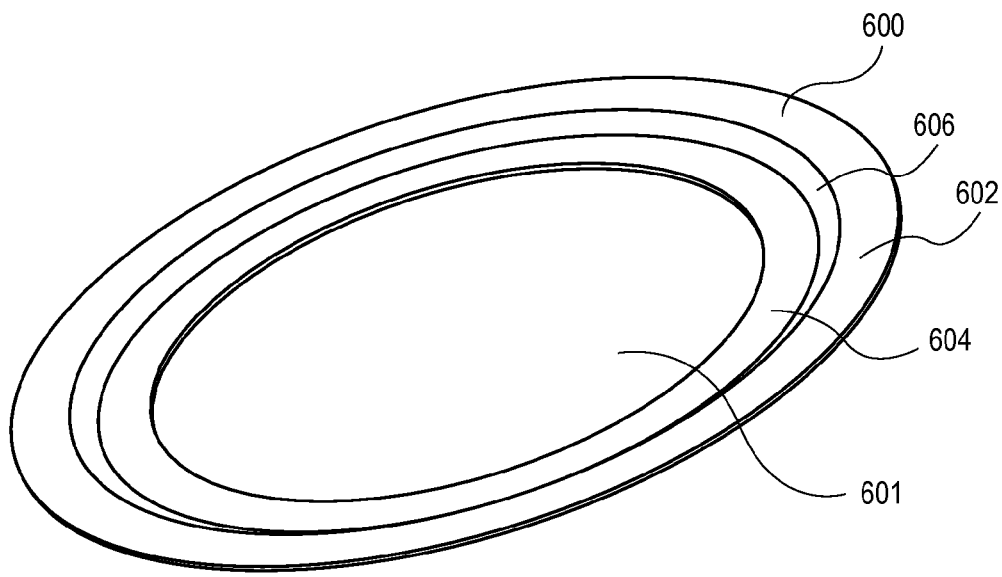
FIG. 6 illustrates an angled top view and angled bottom view of a plasma thermal shield, in accordance with an embodiment of the present invention.
Figure 6:
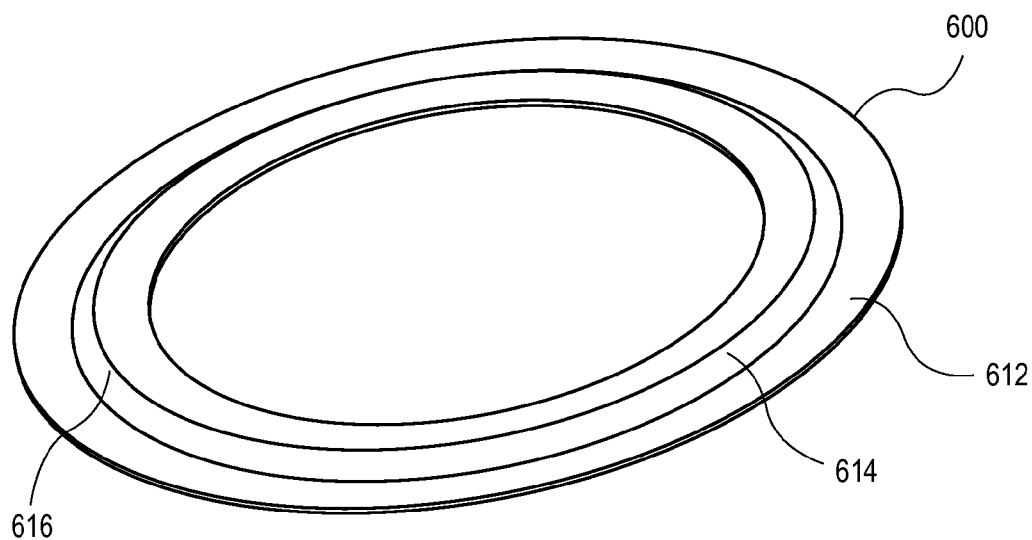

As an example FIG. 6 illustrates an angled top view and angled bottom view of a plasma thermal shield, in accordance with an embodiment of the present invention. Referring to the top view of FIG. 6, a plasma thermal shield 600 is an annular ring with an inner opening 601. In an embodiment, the plasma thermal shield 600 is sized and shaped to be compatible with, e.g., by nesting upon a top surface of, a shadow ring included in a plasma processing chamber. For example, in one such embodiment, the surface of the plasma thermal shield 600 shown in the top view is the surface exposed to a plasma during processing. The surface of the top view includes a first upper surface region 602 which is raised above a second upper surface region 604. The first and second upper surfaces 602 and 604, respectively, are coupled by a sloping region 606.

Referring to the bottom view of FIG. 6, the plasma thermal shield 600 has a bottom surface that is not exposed to a plasma during processing. The surface of the bottom view includes a first lower surface region 612 which is below a second lower surface region 614. The first and second lower surfaces 612 and 614, respectively, are coupled by a sloping region 616. In general, from a high level view, in an embodiment, the bottom surface of the plasma thermal shield 600 reciprocates the general topography of the upper surface. However, some regions of the bottom surface of the plasma thermal shield 600 may be removed for heat dissipating applications.

In an embodiment, the plasma thermal shield 600 is ultimately for nesting on an upper surface of a shadow ring (which, in an embodiment, is an actively-cooled shadow ring as described in association with FIG. 5). In an embodiment, the plasma thermal shield 600 and the shadow ring are installed as two separate components. In an embodiment, the plasma thermal shield 600 blocks heat transfer to the shadow ring which is in contact with a tape frame of a substrate or wafer carrier.

Thus, in an embodiment, a plasma thermal shield is cross-sectionally a shell of ceramic located on top of an existing shadow ring. In one embodiment, the material of the plasma thermal shield is the same material as the shadow ring and covers the entire top surface of the shadow ring. The top surface of the plasma thermal shield may or may not be conformal to the shadow ring below. In one embodiment, the top surface of a plasma thermal shield is a continuous surface and the underside has removed areas of material to reduce conduction to the shadow ring. In an embodiment, the contact points between a plasma thermal shield and shadow ring are related to prohibiting plasma into removed areas as well as installation alignment. It is to be appreciated that the removed area cannot be so great as to create a significant plasma in the removed areas. In the plasma environment, the heat generated by the plasma is transferred to the plasma thermal shield. The plasma thermal shield increase in temperature heats up and radiates the heat to the shadow ring below. However, the shadow ring is heated only by radiated energy from the plasma thermal shield and not by direct plasma contact.

In an embodiment, a plasma thermal shield is a single passive part. The shape and material of the plasma thermal shield can be modified for different process conditions. In an embodiment, the plasma thermal shield can be used to reduce the temperature of a shadow ring by a factor in the range of 100-120 degrees Celsius. The plasma thermal shield may also be used as a differentiated material cover for process chemistry modification, essentially providing a dopant source to the plasma process.

In an embodiment, a plasma thermal shield is used together with an actively-cooled shadow ring. Thus, possible assemblies described herein for protecting a substrate or wafer carrier during plasma processing include an actively-cooled shadow ring, a shadow ring having a plasma thermal shield thereon, or an actively-cooled shadow ring having a plasma thermal shield thereon. In all three scenarios, from a plan view perspective, a protective annular ring with exposing inner region is provided for plasma processing of the carrier.

In an aspect of the present invention, an etch reactor is configured to accommodate etching of a thin wafer or substrate supported by a substrate carrier. For example, FIG. 7 illustrates a cross-sectional view of an etch reactor, in accordance with an embodiment of the present invention.

Figure 7:
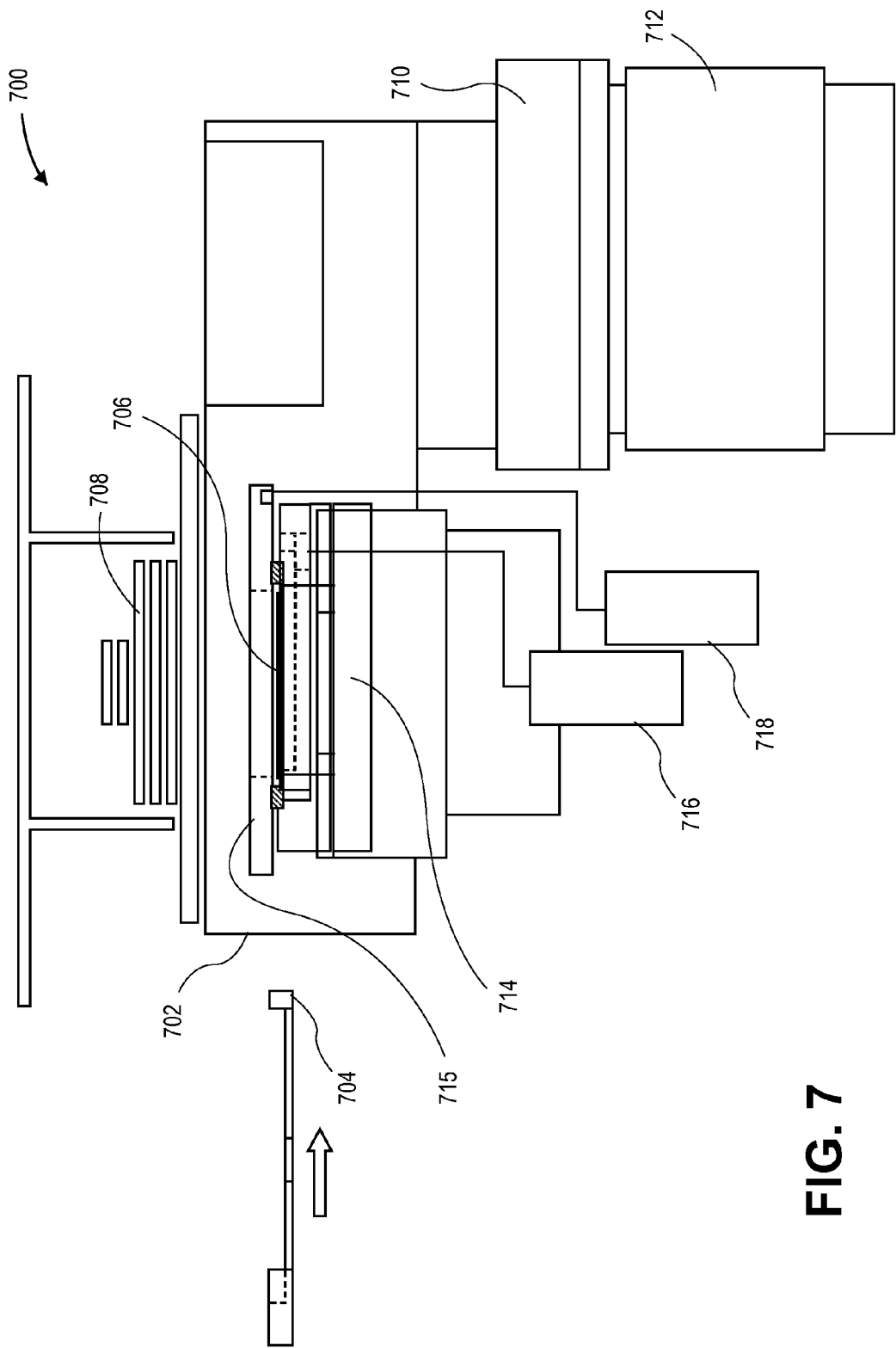
FIG. 7 illustrates a cross-sectional view of an etch reactor, in accordance with an embodiment of the present invention.

Referring to FIG. 7, an etch reactor 700 includes a chamber 702. An end effector 704 is included for transferring a substrate carrier 706 (such as described in association with FIG. 4A) to and from chamber 702. An inductively coupled plasma (ICP) source 708 is positioned in an upper portion of the chamber 702. The chamber 702 is further equipped with a throttle valve 710 and a turbo molecular pump 712. The etch reactor 700 also includes a cathode assembly 714 (e.g., an assembly including an etch cathode or etch electrode). A shadow ring assembly 715 is included above the region accommodating the substrate or wafer carrier 706. In an embodiment, the shadow ring assembly 715 is one of a shadow ring, an actively-cooled shadow ring, a shadow ring having a plasma thermal shield thereon, or an actively-cooled shadow ring having a plasma thermal shield thereon. A shadow ring actuator 718 may be included for moving the shadow ring. Other actuators, such as actuator 716 may also be included.

In an embodiment, the end effector 704 is a robot blade sized for handling a substrate carrier. In one such embodiment, the robotic end effector 704 supports a film frame assembly (e.g., substrate carrier 400 from FIG. 4A) during transfer to and from an etch reactor under sub-atmospheric pressure (vacuum). The end effector 704 includes features to support the substrate carrier in the X-Y-Z axis with gravity-assist. The end effector 704 also includes a feature to calibrate and center the end effector with respect to circular features of a processing tool (e.g., an etch cathode center, or a center of a circular silicon wafer).

In one embodiment, an etch electrode of the cathode assembly 714 is configured to allow RF and thermal coupling with the substrate carrier to enable plasma etching. However, in an embodiment, the etch electrode only contacts a backing tape portion of a substrate carrier and not the frame of the substrate carrier.

In an embodiment, the shadow ring 715 includes a protective annular ring, a lift hoop, and three supporting pins coupled between the lift hoop and the protective annular ring, as described in association with FIG. 5. The lift hoop is disposed in a processing volume radially outwards of a supporting assembly. The lift hoop is mounted on shaft in a substantially horizontal orientation. The shaft is driven by an actuator to move the lift hoop vertically in the processing volume. The three supporting pins extend upward from the lift hoop and position the protective annular ring above the supporting assembly. The three supporting pins may fixedly attach the protective annular ring to the lift hoop. The protective annular ring moves vertically with the lift hoop in the processing volume so that the protective annular ring can be positioned at a desired distance above a substrate and/or an exterior substrate handling device (such as a substrate carrier) can enter the processing volume between the protective annular ring and the supporting assembly to transfer the substrate. The three supporting pins may be positioned to allow the substrate carrier to be transferred in and out of a processing chamber between the supporting pins.

In another aspect, a hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. In an embodiment, the wafer or substrate is supported by a substrate carrier and has an overlying adhesive tape disposed thereon during the singulation process.

Figure 8:
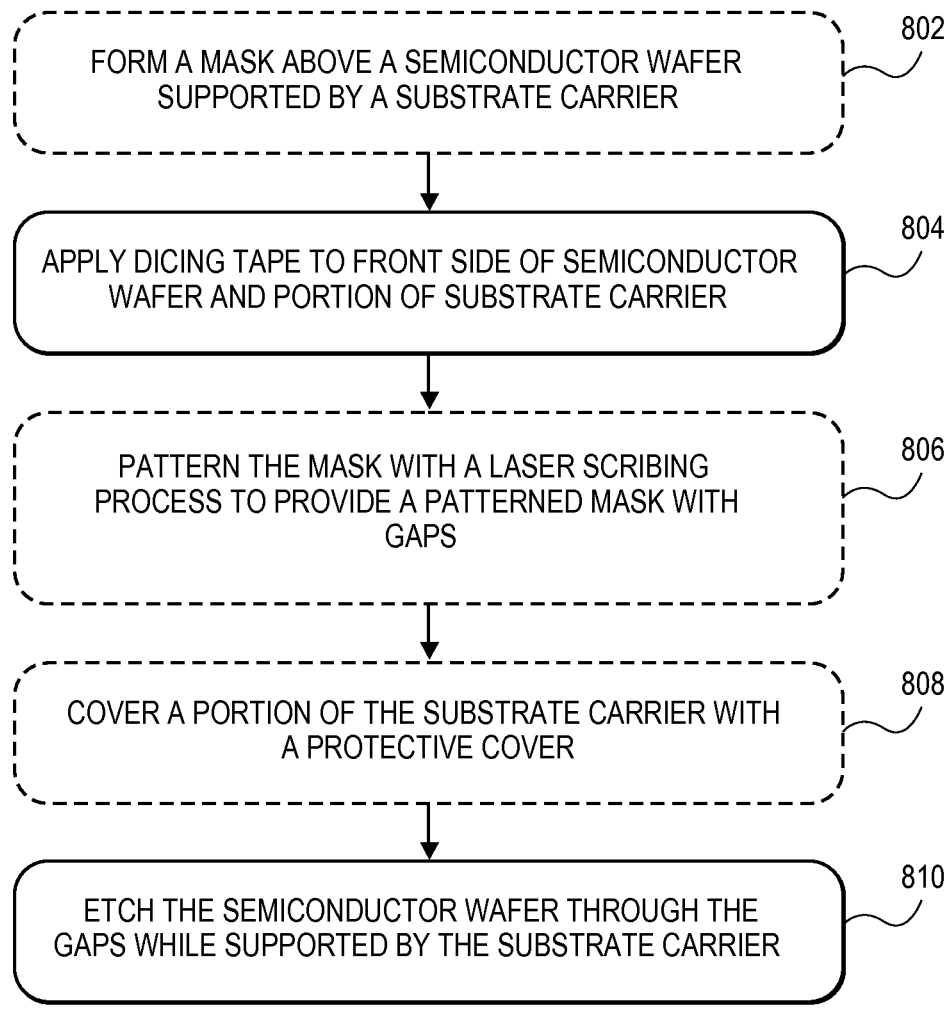
FIG. 8 is a Flowchart representing operations in a method of dicing a semiconductor wafer including a plurality of integrated circuits, in accordance with an embodiment of the present invention.
Figure 9A:
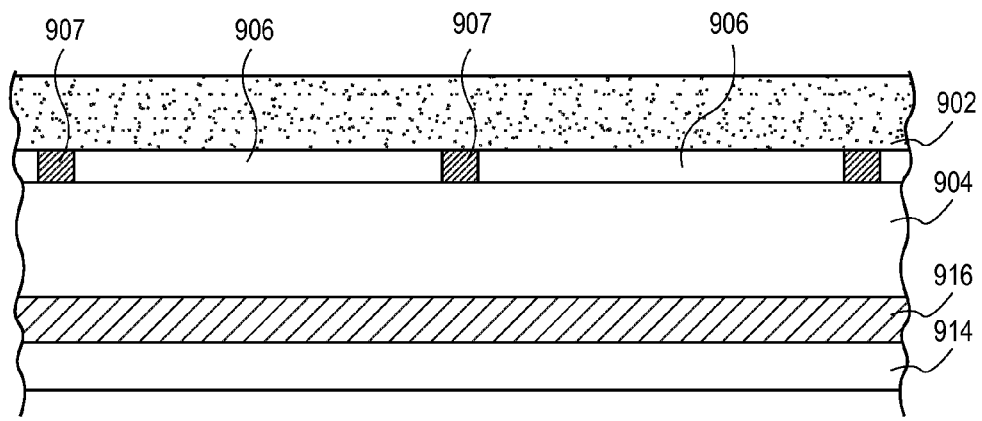
FIG. 9A illustrates a cross-sectional view of a semiconductor wafer including a plurality of integrated circuits during performing of a method of dicing the semiconductor wafer, corresponding to operation 802 of the Flowchart of FIG. 8, in accordance with an embodiment of the present invention.
Figure 9B:
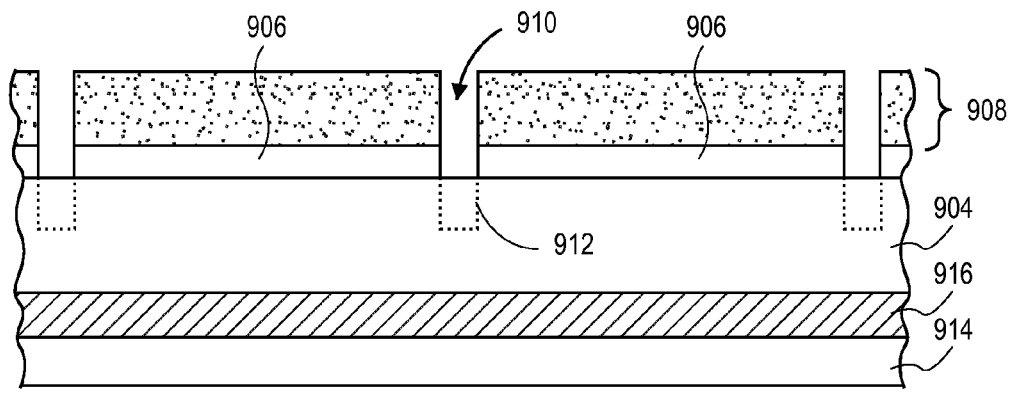
FIG. 9B illustrates a cross-sectional view of a semiconductor wafer including a plurality of integrated circuits during performing of a method of dicing the semiconductor wafer, corresponding to operation 806 of the Flowchart of FIG. 8, in accordance with an embodiment of the present invention.
Figure 9C:
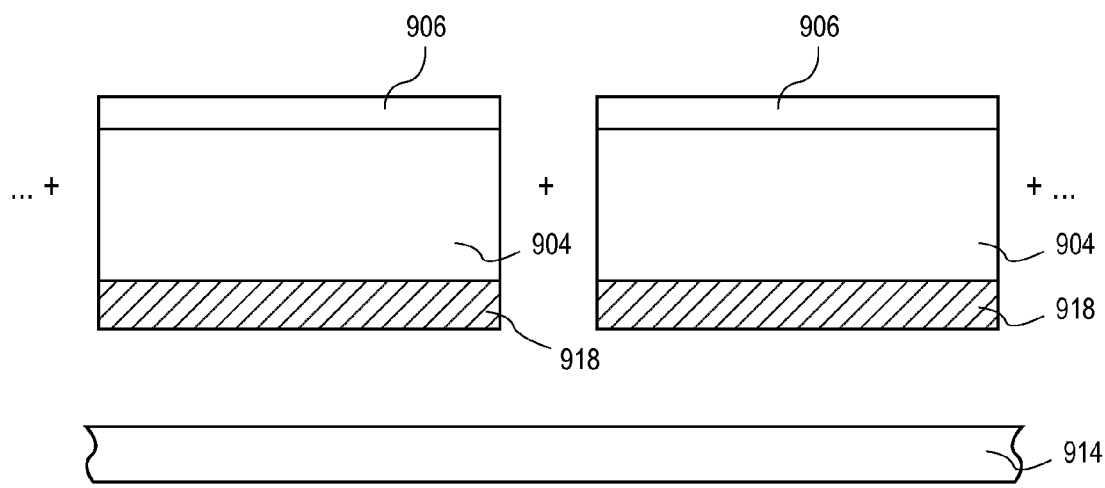
FIG. 9C illustrates a cross-sectional view of a semiconductor wafer including a plurality of integrated circuits during performing of a method of dicing the semiconductor wafer, corresponding to operation 810 of the Flowchart of FIG. 8, in accordance with an embodiment of the present invention.

As an example, FIG. 8 is a Flowchart 800 representing operations in a method of dicing a semiconductor wafer including a plurality of integrated circuits, in accordance with an embodiment of the present invention. FIGS. 9A-9C illustrate cross-sectional views of a semiconductor wafer including a plurality of integrated circuits during performing of a method of dicing the semiconductor wafer, corresponding to operations of Flowchart 800, in accordance with an embodiment of the present invention.

Referring to operation 802 of Flowchart 800, and corresponding FIG. 9A, a mask 902 is optionally formed above a semiconductor wafer or substrate 904. The mask 902 is composed of a layer covering and protecting integrated circuits 906 formed on the surface of semiconductor wafer 904. The mask 902 also covers intervening streets 907 formed between each of the integrated circuits 906. The semiconductor wafer or substrate 904 is supported by a substrate carrier 914.

In an embodiment, the substrate carrier 914 includes a layer of backing tape, a portion of which is depicted as 914 in FIG. 9A, surrounded by a tape ring or frame (not shown). In one such embodiment, the semiconductor wafer or substrate 904 is disposed on a die attach film 916 disposed on the substrate carrier 914, as is depicted in FIG. 9A. In an embodiment, referring to operation 804 of Flowchart 800 and as described in association with FIGS. 2C, 3 and 4A, an adhesive tape (not shown) is adhered to the front side of the substrate 904 and to at least a portion of the substrate carrier 914 (e.g., to exposed outer regions of the backing tape and, possibly, to the frame or tape ring). The adhesive tape includes an opening exposing an inner region of the front side of the semiconductor wafer. In one such embodiment, the mask 902 is formed prior to adhering the adhesive tape to the front side of the substrate 904 and, possibly, the adhesive tape overlaps a portion of the mask 902. In another embodiment, however, the mask 902 is formed subsequent to adhering the adhesive tape to the front side of the substrate 904 and, possibly, the mask 902 overlaps a portion of the adhesive tape.

In accordance with an embodiment of the present invention, forming the mask 902 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, the mask 902 is a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, the mask 902 is a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, the semiconductor wafer or substrate 904 is composed of a material suitable to withstand a fabrication process and upon which semiconductor processing layers may suitably be disposed. For example, in one embodiment, semiconductor wafer or substrate 904 is composed of a group IV-based material such as, but not limited to, crystalline silicon, germanium or silicon/germanium. In a specific embodiment, providing semiconductor wafer 904 includes providing a monocrystalline silicon substrate. In a particular embodiment, the monocrystalline silicon substrate is doped with impurity atoms. In another embodiment, semiconductor wafer or substrate 904 is composed of a III-V material such as, e.g., a III-V material substrate used in the fabrication of light emitting diodes (LEDs).

In an embodiment, the semiconductor wafer or substrate 904 has a thickness of approximately 300 microns or less and, possibly, a thickness of 100 microns or less. For example, in one embodiment, a bulk single-crystalline silicon substrate is thinned from the backside prior to being affixed to the die attach film 916. The thinning may be performed by a backside grind process. In one embodiment, the bulk single-crystalline silicon substrate is thinned to a thickness approximately in the range of 50-300 microns. It is important to note that, in an embodiment, the thinning is performed prior to a laser ablation and plasma etch dicing process. In an embodiment, the die attach film 916 (or any suitable substitute capable of bonding a thinned or thin wafer or substrate to the substrate carrier 914) has a thickness of approximately 20 microns.

In an embodiment, the semiconductor wafer or substrate 904 has disposed thereon or therein, as a portion of the integrated circuits 906, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 906. Materials making up the streets 907 may be similar to or the same as those materials used to form the integrated circuits 906. For example, streets 907 may be composed of layers of dielectric materials, semiconductor materials, and metallization. In one embodiment, one or more of the streets 907 includes test devices similar to the actual devices of the integrated circuits 906.

Referring to operation 806 of Flowchart 800, and corresponding FIG. 9B, the mask 902 is optionally patterned with a laser scribing process to provide a patterned mask 908 with gaps 910, exposing regions of the semiconductor wafer or substrate 904 between the integrated circuits 906. In one such embodiment, the laser scribing process is a femtosecond-based laser scribing process. The laser scribing process may be used to remove the material of the streets 907 originally formed between the integrated circuits 906. In accordance with an embodiment of the present invention, patterning the mask 902 with the laser scribing process includes forming trenches 912 partially into the regions of the semiconductor wafer 904 between the integrated circuits 906, as is depicted in FIG. 9B.

In an embodiment, the adhesive tape described in association with operation 804 of Flowchart 800 protects an outer portion of the carrier tape 914 from misfires during the laser scribing process. In other embodiment, however, instead of a laser scribing process, patterning of the mask may be achieved by, e.g., screen printing a patterned mask, photolithography, or by applying a pre-patterned dry laminate mask. In other embodiments, maskless processes are used, such as an approach employing a dry laminate underfill layer as a mask.

In an embodiment, patterning the mask 902 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 902, the streets 907 and, possibly, a portion of the semiconductor wafer or substrate 904.

Figure 10:
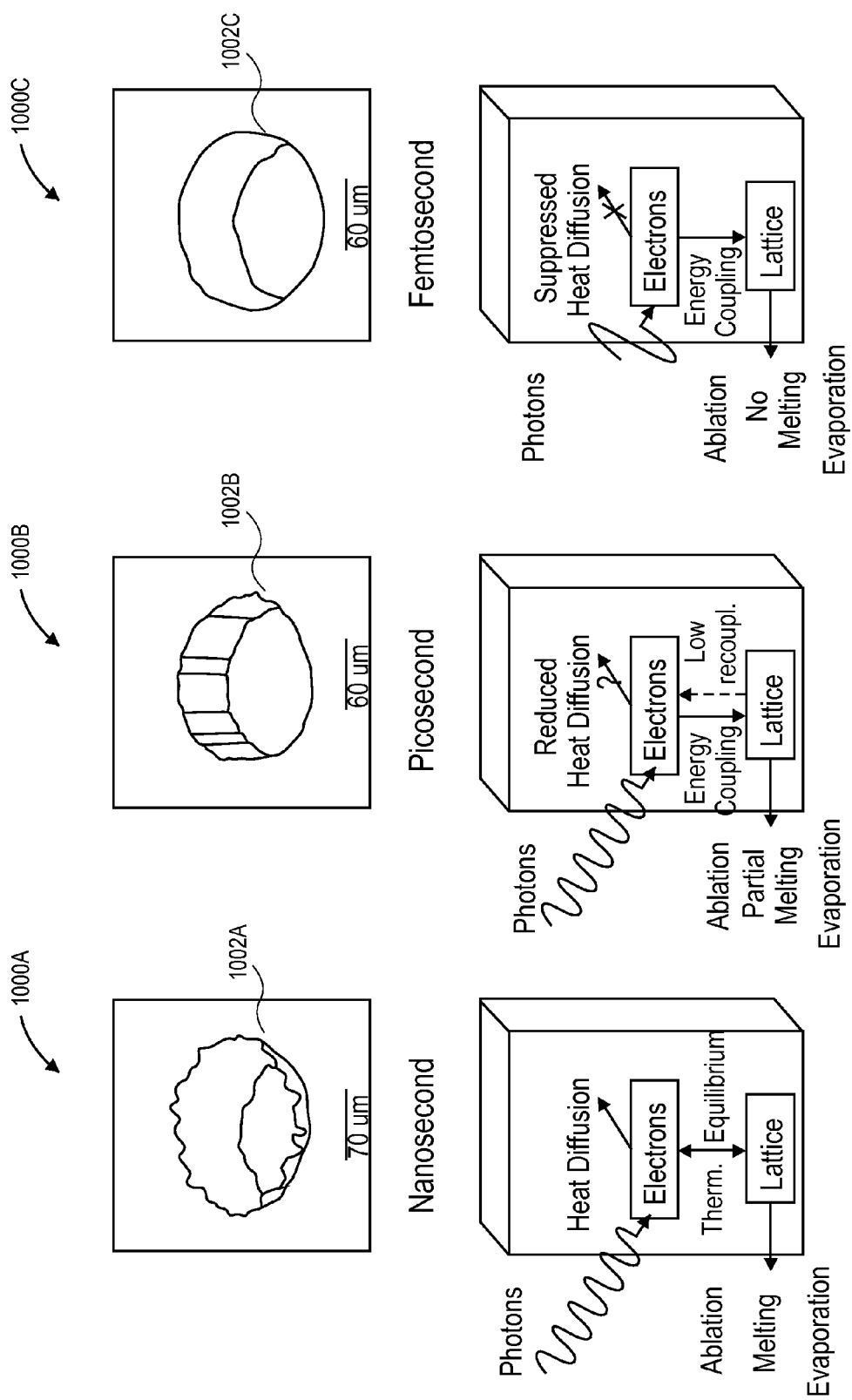
FIG. 10 illustrates the effects of using a laser pulse in the femtosecond range versus longer pulse times, in accordance with an embodiment of the present invention.

FIG. 10 illustrates the effects of using a laser pulse in the femtosecond range versus longer frequencies, in accordance with an embodiment of the present invention. Referring to FIG. 10, by using a laser with a pulse width in the femtosecond range heat damage issues are mitigated or eliminated (e.g., minimal to no damage 1002C with femtosecond processing of a via 1000C) versus longer pulse widths (e.g., damage 1002B with picosecond processing of a via 1000B and significant damage 1002A with nanosecond processing of a via 1000A). The elimination or mitigation of damage during formation of via 1000C may be due to a lack of low energy recoupling (as is seen for picosecond-based laser ablation) or thermal equilibrium (as is seen for nanosecond-based laser ablation), as depicted in FIG. 10.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

By contrast, if non-optimal laser parameters are selected, in a stacked structure that involves, e.g., two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to optional operation 808 of Flowchart 800, in accordance with an embodiment of the present invention, a portion of the substrate carrier is covered with a shadow ring (such as an actively-cooled shadow ring) or a plasma thermal shield, or both, in preparation for an etch portion of the dicing process. In one embodiment, the shadow ring or a plasma thermal shield, or both, is included in a plasma etching chamber. In one embodiment, the shadow ring or a plasma thermal shield, or a combination of both, leaves exposed a portion of, but not all of, the semiconductor wafer or substrate 904, as described above in association with FIG. 4B. In an embodiment, at least a portion of the adhesive tape described in association with operation 806 of Flowchart 800 is covered by a shadow ring or a plasma thermal shield, or both, e.g., during the plasma etching described below.

Referring to operation 810 of Flowchart 800, and to corresponding FIG. 9C, the semiconductor wafer or substrate 904 is etched through the gaps 910 in the patterned mask 908 to singulate the integrated circuits 906. In accordance with an embodiment of the present invention, etching the semiconductor wafer 904 includes etching to extend the trenches 912 formed with the laser scribing process and to ultimately etch entirely through semiconductor wafer or substrate 904, as depicted in FIG. 9C.

In an embodiment, etching the semiconductor wafer or substrate 904 includes using a plasma etching process. In one embodiment, a through-silicon via type etch process is used. For example, in a specific embodiment, the etch rate of the material of semiconductor wafer or substrate 904 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. The combination enables effective decoupling of the ion density from ion energy, so as to achieve relatively high density plasmas without the high, potentially damaging, DC bias levels, even at very low pressures. An exceptionally wide process window results. However, any plasma etch chamber capable of etching silicon may be used. In an exemplary embodiment, a deep silicon etch is used to etch a single crystalline silicon substrate or wafer 904 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In one embodiment, however, a Bosch process is used which involves formation of a scalloped profile.

In an embodiment, singulation may further include patterning of die attach film 916. In one embodiment, die attach film 916 is patterned by a technique such as, but not limited to, laser ablation, dry (plasma) etching or wet etching. In an embodiment, the die attach film 916 is patterned in sequence following the laser scribe and plasma etch portions of the singulation process to provide die attach film portions 918, as depicted in FIG. 9C. In an embodiment, the patterned mask 908 is removed after the laser scribe and plasma etch portions of the singulation process, as is also depicted in FIG. 9C. The patterned mask 908 may be removed prior to, during, or following patterning of the die attach film 916. In an embodiment, the semiconductor wafer or substrate 904 is etched while supported by the substrate carrier 914. In an embodiment, the die attach film 916 is also patterned while disposed on the substrate carrier 914.

Accordingly, referring again to Flowchart 800 and FIGS. 9A-9C, wafer dicing may be preformed by initial laser ablation through a mask, through wafer streets (including metallization), and partially into a silicon substrate. The laser pulse width may be selected in the femtosecond range. Die singulation may then be completed by subsequent through-silicon deep plasma etching. In an embodiment, the substrate dicing is performed on a substrate carrier. In one embodiment, an adhesive tape such as a dicing tape is applied to the front side of the substrate and to a portion of the substrate carrier in order to reduce edge warping of the substrate. In one embodiment, a shadow ring or a plasma thermal shield, or both, are implemented during the etch portion of the dicing process and, possibly, covers at least a portion of the front side adhesive tape. Additionally, removal of exposed portions of a die attach film may be performed to provide singulated integrated circuits, each having a portion of a die attach film thereon. The individual integrated circuits, including die attach film portions may then be removed from the substrate carrier 914, as depicted in FIG. 9C. In an embodiment, the singulated integrated circuits are removed from the substrate carrier 914 for packaging. In one such embodiment, the patterned die attach film 918 is retained on the backside of each integrated circuit and included in the final packaging. However, in another embodiment, the patterned die attach film 914 is removed during or subsequent to the singulation process.

Referring again to FIGS. 9A-9C, the plurality of integrated circuits 906 may be separated by streets 907 having a width of approximately 10 microns or smaller. The use of a laser scribing approach (such as a femtosecond-based laser scribing approach) may enable such compaction in a layout of integrated circuits, at least in part due to the tight profile control of the laser. For example, FIG. 11 illustrates compaction on a semiconductor wafer or substrate achieved by using narrower streets versus conventional dicing which may be limited to a minimum width, in accordance with an embodiment of the present invention.

Figure 11:
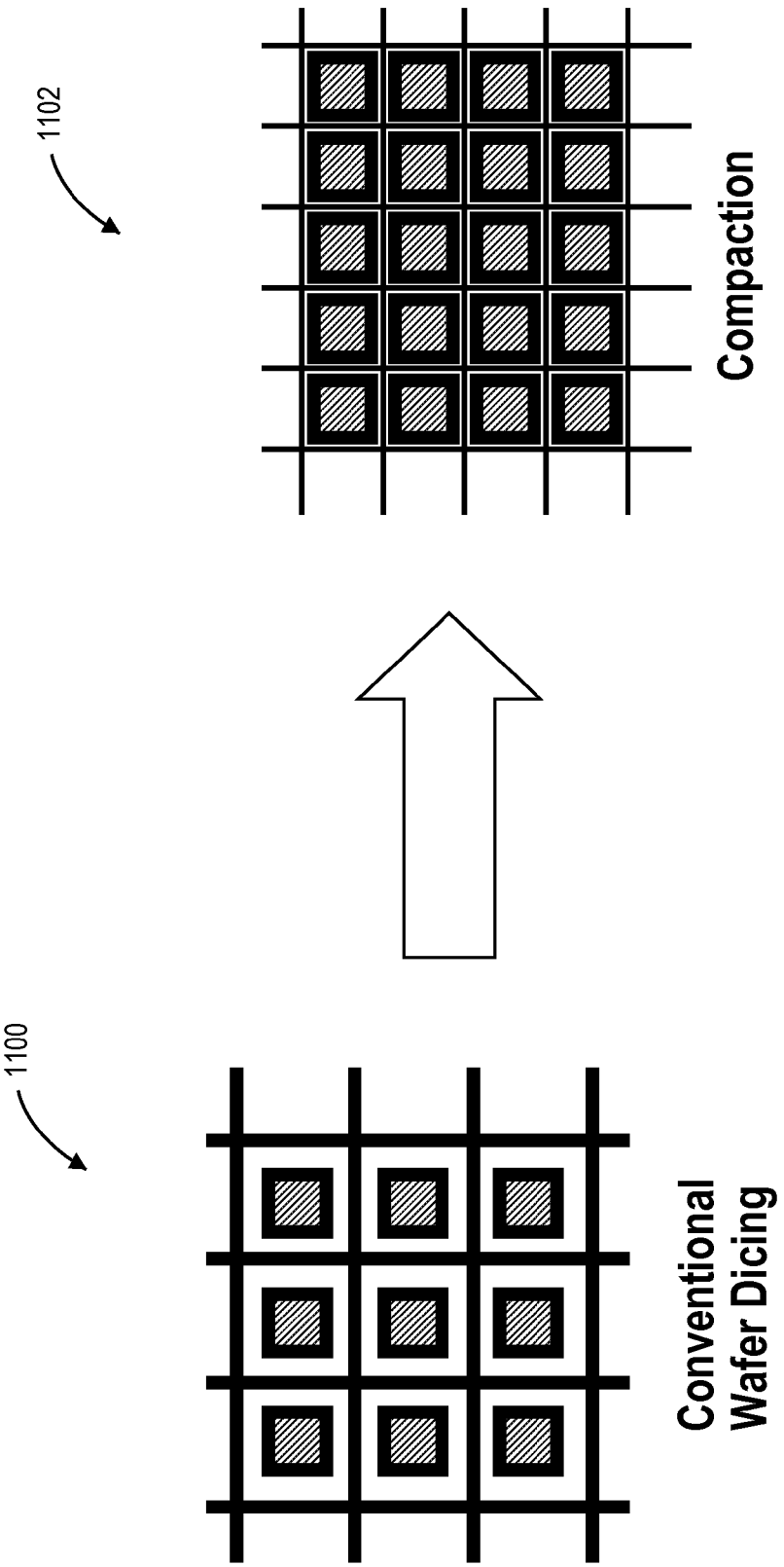
FIG. 11 illustrates compaction on a semiconductor wafer achieved by using narrower streets versus conventional dicing which may be limited to a minimum width, in accordance with an embodiment of the present invention.

Referring to FIG. 11, compaction on a semiconductor wafer is achieved by using narrower streets (e.g., widths of approximately 10 microns or smaller in layout 1102) versus conventional dicing which may be limited to a minimum width (e.g., widths of approximately 70 microns or larger in layout 1100). It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits.

Figure 12:
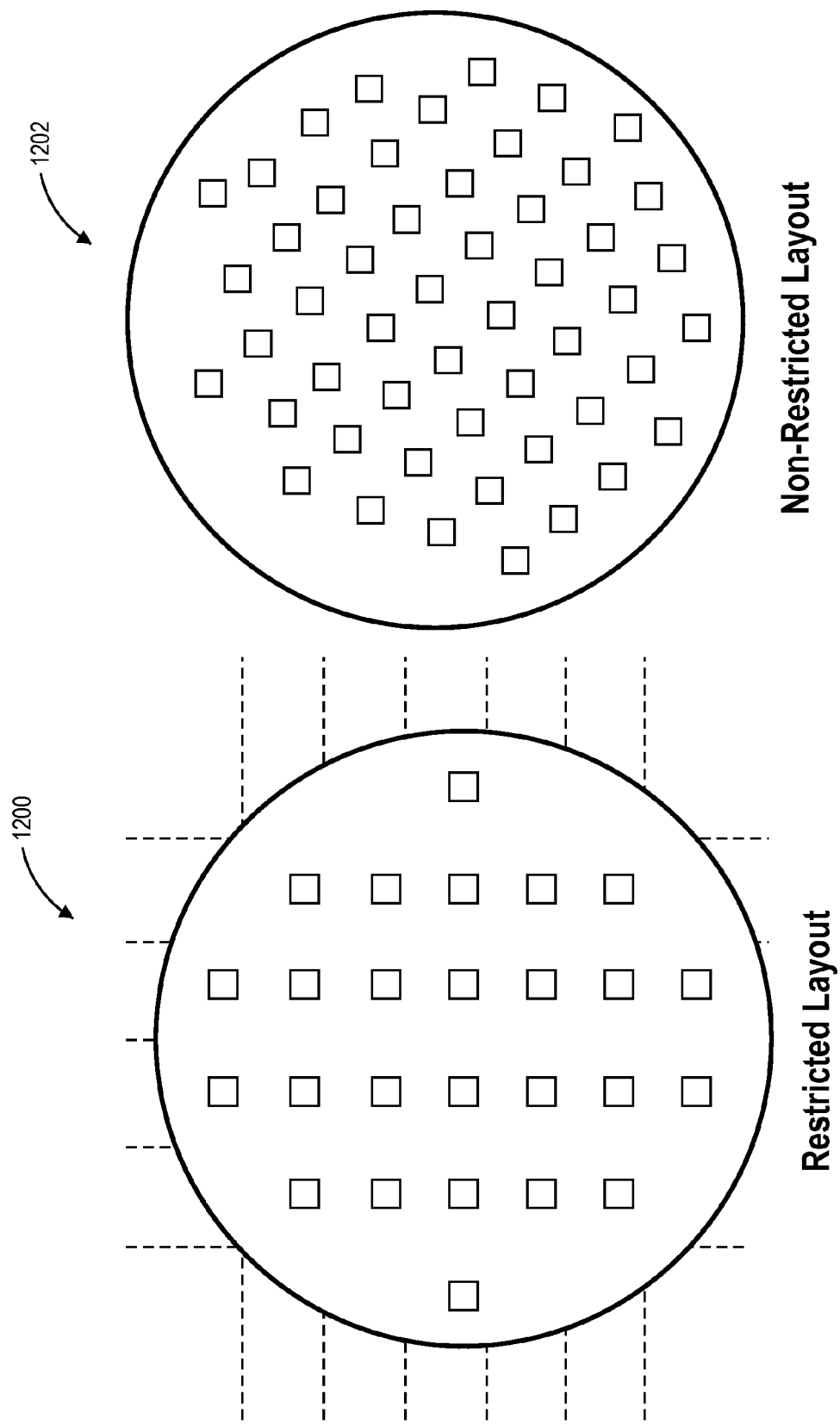
FIG. 12 illustrates freeform integrated circuit arrangement allowing denser packing and, hence, more die per wafer versus grid alignment approaches, in accordance with an embodiment of the present invention.

Referring again to FIGS. 9A-9C, the plurality of integrated circuits 906 may be arranged on semiconductor wafer or substrate 904 in a non-restricted layout. For example, FIG. 12 illustrates a freeform integrated circuit arrangement allowing denser packing. The denser packing may provide for more die per wafer versus grid alignment approaches, in accordance with an embodiment of the present invention. Referring to FIG. 12, a freeform layout (e.g., a non-restricted layout on semiconductor wafer or substrate 1202) allows denser packing and hence more die per wafer versus grid alignment approaches (e.g., a restricted layout on semiconductor wafer or substrate 1200). In an embodiment, the speed of the laser ablation and plasma etch singulation process is independent of die size, layout or the number of streets.

A single process tool may be configured to perform many or all of the operations in a hybrid laser ablation and plasma etch singulation process. For example, FIG. 13 illustrates a block diagram of a tool layout for laser and plasma dicing of wafers or substrates, in accordance with an embodiment of the present invention.

Figure 13:
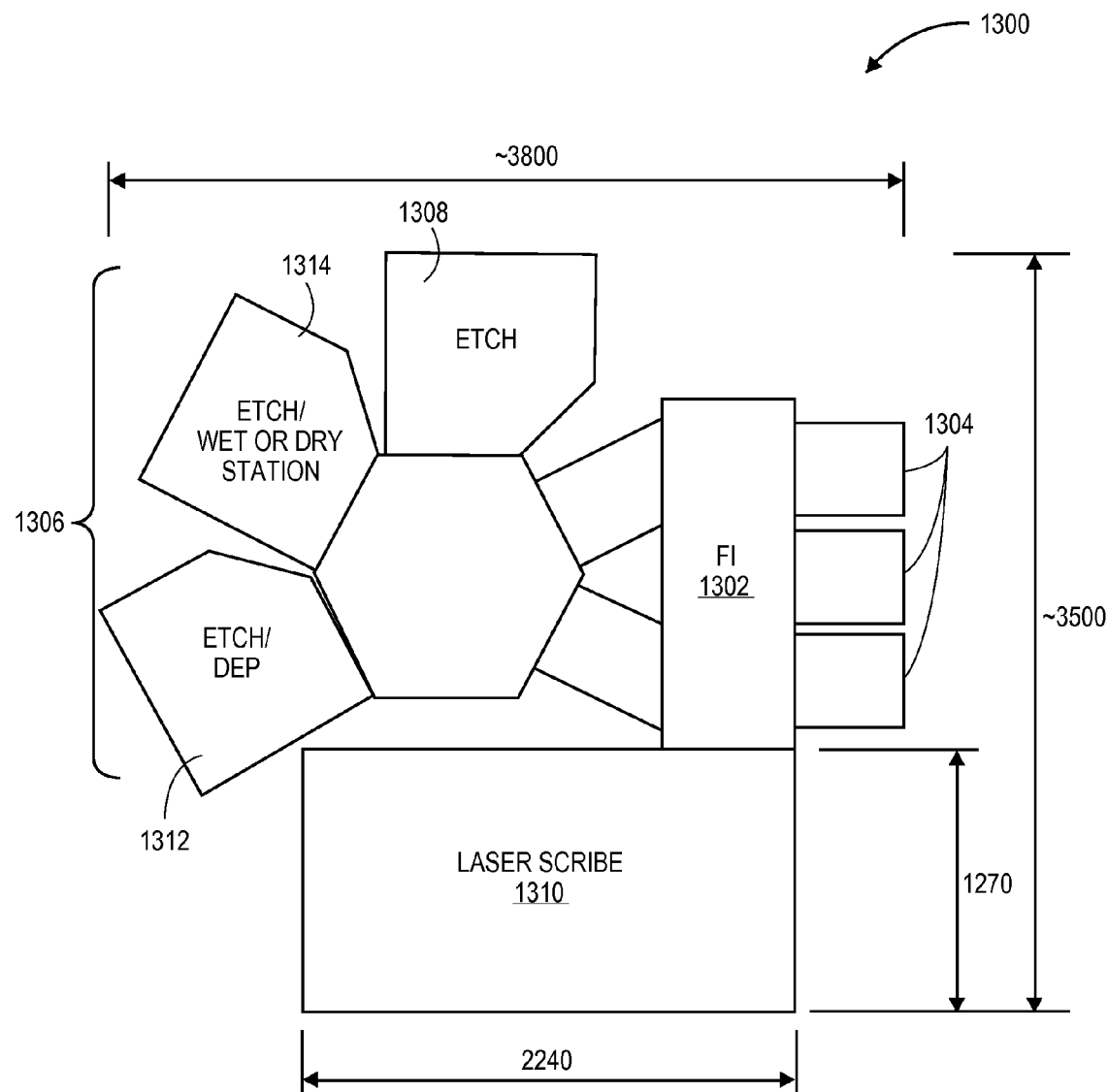
FIG. 13 illustrates a block diagram of a tool layout for laser and plasma dicing of wafers or substrates, in accordance with an embodiment of the present invention.

Referring to FIG. 13, a process tool 1300 includes a factory interface 1302 (FI) having a plurality of load locks 1304 coupled therewith. A cluster tool 1306 is coupled with the factory interface 1302. The cluster tool 1306 includes one or more plasma etch chambers, such as plasma etch chamber 1308. A laser scribe apparatus 1310 is also coupled to the factory interface 1302. The overall footprint of the process tool 1300 may be, in one embodiment, approximately 3500 millimeters (3.5 meters) by approximately 3800 millimeters (3.8 meters), as depicted in FIG. 13.

In an embodiment, the laser scribe apparatus 1310 houses a femtosecond-based laser. The femtosecond-based laser may be suitable for performing a laser ablation portion of a hybrid laser and etch singulation process, such as the laser abalation processes described above. In one embodiment, a moveable stage is also included in laser scribe apparatus 1300, the moveable stage configured for moving a wafer or substrate (or a carrier thereof) relative to the femtosecond-based laser. In a specific embodiment, the femtosecond-based laser is also moveable. The overall footprint of the laser scribe apparatus 1310 may be, in one embodiment, approximately 2240 millimeters by approximately 1270 millimeters, as depicted in FIG. 13.

In an embodiment, the one or more plasma etch chambers 1308 is configured for etching a wafer or substrate through the gaps in a patterned mask to singulate a plurality of integrated circuits. In one such embodiment, the one or more plasma etch chambers 1308 is configured to perform a deep silicon etch process. In a specific embodiment, the one or more plasma etch chambers 1308 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 1308 to facilitate high silicon etch rates. In an embodiment, more than one etch chamber is included in the cluster tool 1306 portion of process tool 1300 to enable high manufacturing throughput of the singulation or dicing process. In accordance with an embodiment of the present invention, one or more of the etch chambers is equipped with a shadow ring or a plasma thermal shield, or both.

The factory interface 1302 may be a suitable atmospheric port to interface between an outside manufacturing facility with laser scribe apparatus 1310 and cluster tool 1306. The factory interface 1302 may include robots with arms or blades for transferring wafers (or carriers thereof) from storage units (such as front opening unified pods) into either cluster tool 1306 or laser scribe apparatus 1310, or both.

Cluster tool 1606 may include other chambers suitable for performing functions in a method of singulation. For example, in one embodiment, in place of an additional etch chamber, a deposition chamber 1312 is included. The deposition chamber 1312 may be configured for mask deposition on or above a device layer of a wafer or substrate prior to laser scribing of the wafer or substrate. In one such embodiment, the deposition chamber 1312 is suitable for depositing a water soluble mask layer. In another embodiment, in place of an additional etch chamber, a wet/dry station 1314 is included. The wet/dry station may be suitable for cleaning residues and fragments, or for removing a water soluble mask, subsequent to a laser scribe and plasma etch singulation process of a substrate or wafer. In an embodiment, a metrology station is also included as a component of process tool 1300. In yet another embodiment, in place of an additional etch chamber, a station is included for applying a patterned adhesive or dicing tape to a front side of an apparatus including a substrate or wafer mounted on a substrate carrier. The patterned adhesive or dicing tape may be implemented to reduce or negate warping of the substrate or wafer, especially at the edges of the substrate or wafer.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 1300 described in association with FIG. 13 or with etch chamber 700 described in association with FIG. 7. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 14:
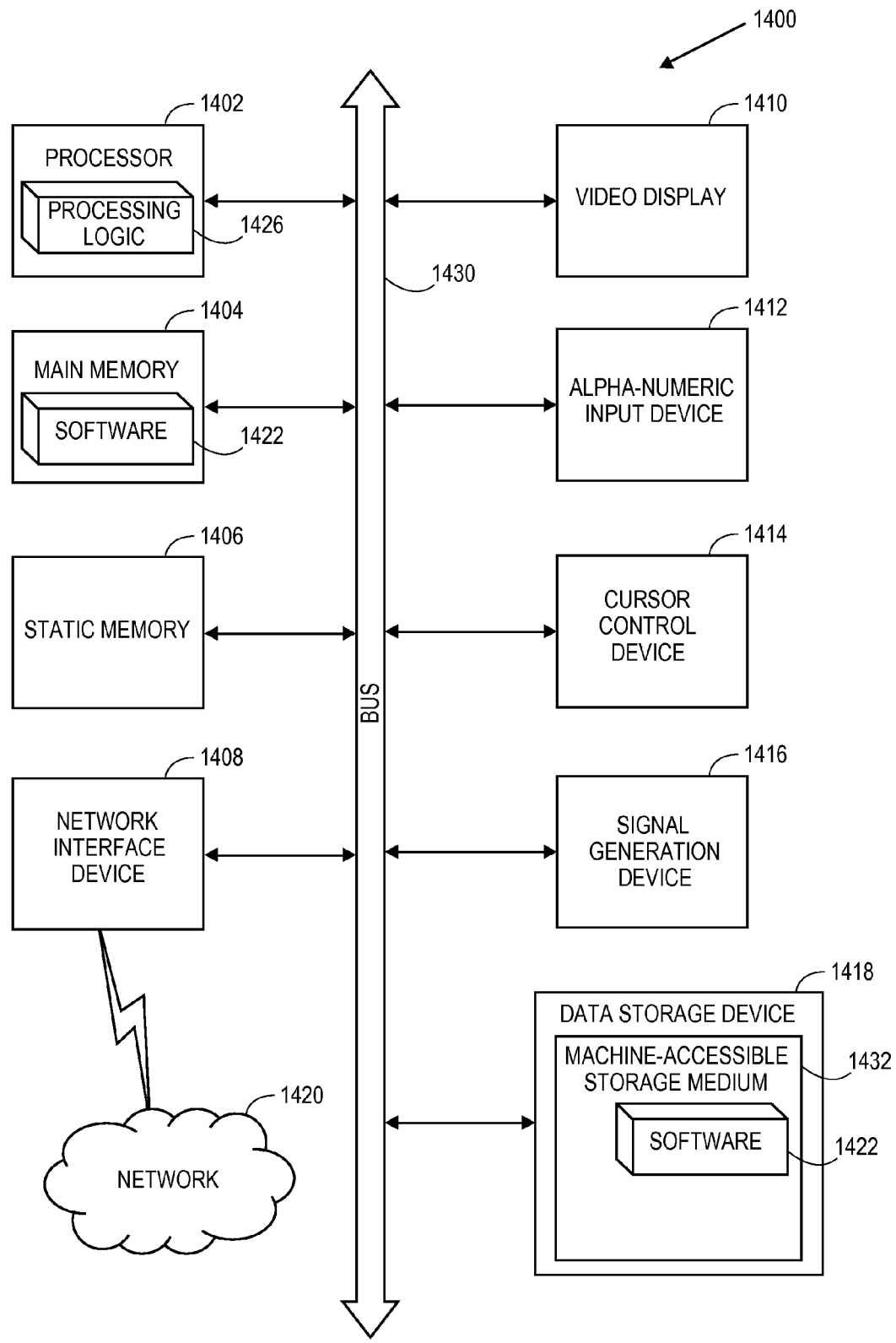
FIG. 14 illustrates a block diagram of an exemplary computer system, in accordance with an embodiment of the present invention.

FIG. 14 illustrates a diagrammatic representation of a machine in the exemplary form of a computer system 1400 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1400 includes a processor 1402, a main memory 1404 (e.g., read-only memory (ROM), flash memory, dynamic random access memory (DRAM) such as synchronous DRAM (SDRAM) or Rambus DRAM (RDRAM), etc.), a static memory 1406 (e.g., flash memory, static random access memory (SRAM), etc.), and a secondary memory 1418 (e.g., a data storage device), which communicate with each other via a bus 1430.

Processor 1402 represents one or more general-purpose processing devices such as a microprocessor, central processing unit, or the like. More particularly, the processor 1402 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1402 may also be one or more special-purpose processing devices such as an application specific integrated circuit (ASIC), a field programmable gate array (FPGA), a digital signal processor (DSP), network processor, or the like. Processor 1402 is configured to execute the processing logic 1426 for performing the operations described herein.

The computer system 1400 may further include a network interface device 1408. The computer system 1400 also may include a video display unit 1410 (e.g., a liquid crystal display (LCD), a light emitting diode display (LED), or a cathode ray tube (CRT)), an alphanumeric input device 1412 (e.g., a keyboard), a cursor control device 1414 (e.g., a mouse), and a signal generation device 1416 (e.g., a speaker).

The secondary memory 1418 may include a machine-accessible storage medium (or more specifically a computer-readable storage medium) 1432 on which is stored one or more sets of instructions (e.g., software 1422) embodying any one or more of the methodologies or functions described herein. The software 1422 may also reside, completely or at least partially, within the main memory 1404 and/or within the processor 1402 during execution thereof by the computer system 1400, the main memory 1404 and the processor 1402 also constituting machine-readable storage media. The software 1422 may further be transmitted or received over a network 1420 via the network interface device 1408.

While the machine-accessible storage medium 1432 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of reducing edge warping in a supported semiconductor wafer. The method involves adhering a backside of a semiconductor wafer to an inner portion of a carrier tape of a substrate carrier comprising a tape frame mounted above the carrier tape. The method also involves adhering an adhesive tape to a front side of the semiconductor wafer and to at least a portion of the substrate carrier. The adhesive tape includes an opening exposing an inner region of the front side of the semiconductor wafer.

Thus, methods of and apparatuses for dicing semiconductor wafers, each wafer having a plurality of integrated circuits, have been disclosed.

What is claimed is:

1. A method of reducing edge warping in a supported semiconductor wafer, the method comprising:
    placing a backside of a semiconductor wafer on an inner portion of a carrier tape of a substrate carrier comprising a tape frame coupled to the carrier tape; and
    applying an adhesion layer to a front side of the semiconductor wafer and to at least a portion of the substrate carrier, the adhesion layer comprising an opening exposing an inner region of the front side of the semiconductor wafer.

2. The method of claim 1, further comprising:
    subsequent to applying the adhesion layer, processing the inner region of the front side of the semiconductor wafer.

3. The method of claim 2, wherein processing the inner region of the front side of the semiconductor wafer comprises dicing the semiconductor wafer from the front side of the semiconductor wafer.

4. The method of claim 3, wherein dicing the semiconductor wafer comprising applying a dicing mask to the front side of the semiconductor wafer.

5. The method of claim 1, further comprising:
    prior to applying the adhesion layer, applying a dicing mask to the front side of the semiconductor wafer; and
    subsequent to applying the adhesion layer, dicing the semiconductor wafer from the front side of the semiconductor wafer.

6. The method of claim 2, wherein processing the inner region of the front side of the semiconductor wafer comprises applying a dry film laminate to the front side of the semiconductor wafer.

7. The method of claim 1, wherein applying the adhesion layer to the front side of the semiconductor wafer comprises applying the adhesion layer to an exposed outer portion of the carrier tape and to at least a portion of the tape frame.

8. The method of claim 1, wherein the opening exposes the inner region comprising at least approximately 98% of the diameter of the front side of the semiconductor wafer.

9. An apparatus including a supported semiconductor wafer, the apparatus comprising:
    a substrate carrier comprising a tape frame coupled to a carrier tape;
    a semiconductor wafer having a backside positioned on an inner portion of the carrier tape; and
    an adhesion layer adhered to a front side of the semiconductor wafer and to at least a portion of the substrate carrier, the adhesion layer comprising an opening exposing an inner region of the front side of the semiconductor wafer.

10. The apparatus of claim 9, wherein the adhesion layer is adhered to an exposed outer portion of the carrier tape and to at least a portion of the tape frame.

11. The apparatus of claim 9, wherein the opening exposes the inner region comprising at least approximately 98% of the diameter of the front side of the semiconductor wafer.

12. The apparatus of claim 9, further comprising:
    a dicing mask disposed on the front side of the semiconductor wafer.

13. The apparatus of claim 9, further comprising:
    a dry film laminate disposed on the front side of the semiconductor wafer.

14. The apparatus of claim 9, wherein the backside of the semiconductor wafer, including edge portions of the semiconductor wafer, is substantially flat.

15. A method of dicing a semiconductor wafer comprising a plurality of integrated circuits, the method comprising:
    introducing a substrate supported by a substrate carrier into a plasma etch chamber, the substrate having a patterned mask thereon covering integrated circuits and exposing streets of the substrate, wherein the substrate carrier comprises a tape frame coupled to a carrier tape and a backside of the substrate is positioned on an inner portion of the carrier tape, and wherein an adhesion layer is adhered to a front side of the substrate and to at least a portion of the substrate carrier and comprises an opening exposing an inner region of the front side of the semiconductor wafer; and
    plasma etching the substrate through the streets to singulate the integrated circuits.

16. The method of claim 15, further comprising:
    forming the patterned mask with a laser scribing process.

17. The method of claim 16, wherein the adhesion layer protects an outer portion of the carrier tape from misfires during the laser scribing process.

18. The method of claim 15, wherein at least a portion of the adhesion layer is covered by a shadow ring or a plasma thermal shield, or both, during the plasma etching.

19. The method of claim 15, wherein the material of the patterned mask is formed on the front side of the substrate prior to applying the adhesion layer to the front side of the substrate.

20. The method of claim 15, wherein the material of the patterned mask is formed on the front side of the substrate subsequent to applying the adhesion layer to the front side of the substrate.

* * * * *